US012588265B2

(12) United States Patent
Li et al.

(10) Patent No.: US 12,588,265 B2
(45) Date of Patent: Mar. 24, 2026

(54) SEMICONDUCTOR STRUCTURE WITH ENHANCED PLACEHOLDER POSITION MARGIN

(71) Applicant: International Business Machines Corporation, Armonk, NY (US)

(72) Inventors: Tao Li, Slingerlands, NY (US); Ruilong Xie, Niskayuna, NY (US); Kisik Choi, Watervliet, NY (US); Shogo Mochizuki, Mechanicville, NY (US)

(73) Assignee: International Business Machines Corporation, Armonk, NY (US)

( * ) Notice: Subject to any disclaimer, the term of this patent is extended or adjusted under 35 U.S.C. 154(b) by 405 days.

(21) Appl. No.: 18/232,603

(22) Filed: Aug. 10, 2023

(65) Prior Publication Data

US 2025/0056864 A1     Feb. 13, 2025

(51) Int. Cl.
| | |
|---|---|
| *H10D 64/23* | (2025.01) |
| *H10D 30/43* | (2025.01) |
| *H10D 30/67* | (2025.01) |
| *H10D 62/10* | (2025.01) |

(52) U.S. Cl.
CPC .......... *H10D 64/256* (2025.01); *H10D 30/43* (2025.01); *H10D 30/6735* (2025.01); *H10D 62/121* (2025.01); *H10D 64/258* (2025.01)

(58) Field of Classification Search
None
See application file for complete search history.

(56) References Cited

U.S. PATENT DOCUMENTS

| | | | |
|---|---|---|---|
| 10,797,139 | B2 | 10/2020 | Morrow et al. |
| 11,437,283 | B2 | 9/2022 | Lilak et al. |
| 11,569,364 | B2 | 1/2023 | Tsai et al. |
| 2021/0111115 | A1 | 4/2021 | Morrow et al. |
| 2021/0134721 | A1 | 5/2021 | Chiang et al. |
| 2021/0202385 | A1 | 7/2021 | Huang et al. |
| 2021/0305252 | A1 | 9/2021 | Chiang et al. |
| 2021/0305381 | A1 | 9/2021 | Chiang et al. |
| 2021/0351303 | A1 | 11/2021 | Ju et al. |
| 2021/0376071 | A1 | 12/2021 | Liu et al. |
| 2021/0376093 | A1 | 12/2021 | Chu et al. |
| 2022/0359689 | A1 | 11/2022 | Chen et al. |
| 2022/0367705 | A1 | 11/2022 | Yu et al. |
| 2022/0384250 | A1 | 12/2022 | Huang et al. |
| 2022/0416041 | A1 | 12/2022 | Hasan et al. |
| 2023/0083432 | A1 | 3/2023 | Cheng et al. |
| 2025/0113537 | A1* | 4/2025 | Xie .................. H01L 21/76897 |
| 2025/0253238 | A1* | 8/2025 | Chu ..................... H10D 64/021 |

* cited by examiner

*Primary Examiner* — Jack S Chen
(74) *Attorney, Agent, or Firm* — Scully, Scott, Murphy & Presser, P.C.; Samuel A. Waldbaum

(57)     ABSTRACT

A semiconductor structure having improved placeholder position margin is provided. The semiconductor structure includes a backside source/drain contact structure contacting one source/drain region of a nanosheet transistor. The backside source/drain contact structure has a first portion and a second portion. The second portion of the backside source/drain contact structure, which is in direct contact with the source/drain region is confined by bottommost upper inner spacers, lower inner spacers and a semiconductor pedestal which vertically separates the bottommost inner spacers from the lower inner spacers.

20 Claims, 38 Drawing Sheets

SEMICONDUCTOR STRUCTURE WITH ENHANCED PLACEHOLDER POSITION MARGIN

BACKGROUND

The present application relates to semiconductor technology, and more particularly to a semiconductor structure having improved placeholder position margin.

In recent years, the semiconductor industry has been transitioning from finFETs to gate-all-around stacked nanosheet transistor architecture. Relative to finFETs, nanosheet transistors deliver more drive current by increasing the channel widths in the same circuit footprint. The gate-all-around design improves channel control and minimizes short-channel effects.

SUMMARY

A semiconductor structure having improved placeholder position margin is provided. The semiconductor structure includes a backside source/drain contact structure contacting one source/drain region of a nanosheet transistor. The backside source/drain contact structure has a first portion and a second portion. The second portion of the backside source/drain contact structure, which is in direct contact with the source/drain region, is confined by bottommost upper inner spacers, lower inner spacers and a semiconductor pedestal which vertically separates the bottommost inner spacers from the lower inner spacers.

In one aspect of the present application, a semiconductor structure is provided. In one embodiment of the present application, the semiconductor structure includes a nanosheet transistor including a plurality of spaced apart and vertically stacked semiconductor channel material nanosheets, a gate structure wrapped around each semiconductor channel material nanosheet of the plurality of spaced apart and vertically stacked semiconductor channel material nanosheets and a pair of source/drain regions. The semiconductor structure further includes upper inner spacers located between each vertically stacked pair of semiconductor channel material nanosheets of the plurality of spaced apart and vertically stacked semiconductor channel material nanosheets and beneath a bottommost semiconductor channel material nanosheet of the plurality of spaced apart and vertically stacked semiconductor channel material nanosheets, and lower inner spacers located beneath bottommost upper inner spacers, wherein each of the lower inner spacers is vertically separated from the bottommost upper inner spacers by a semiconductor pedestal. The semiconductor structure even further includes a backside source/drain contact structure contacting a first source/drain region of the pair of source/drain regions. In accordance with the present application, the backside source/drain contact structure has a first portion a second portion, wherein the second portion of the backside source/drain contact structure is confined by the bottommost upper inner spacers, the lower inner spacers and the semiconductor pedestal.

DETAILED DESCRIPTION

Figure 2A:
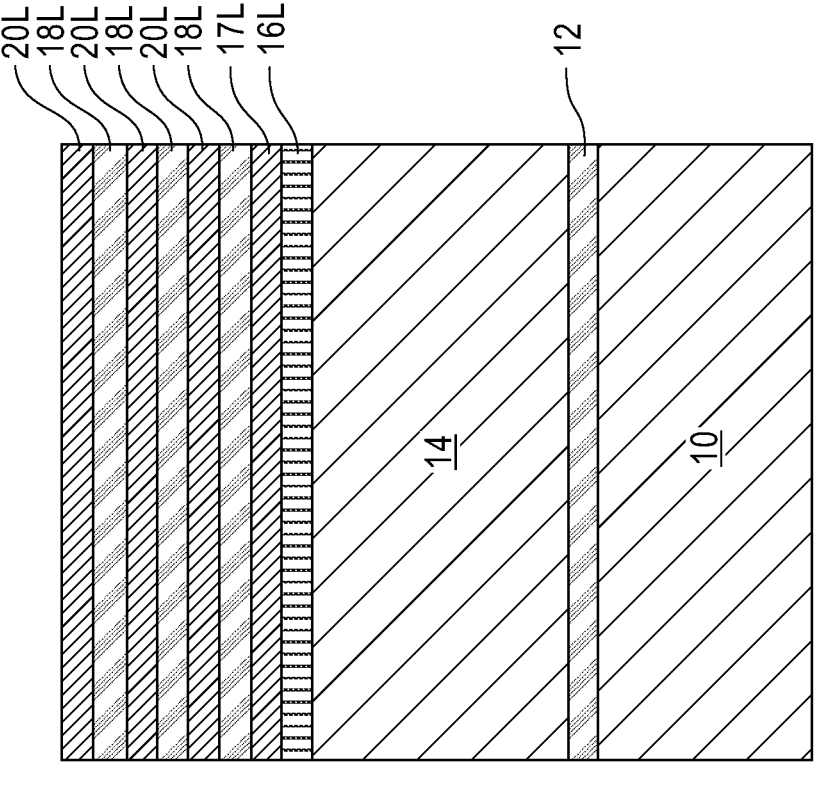
FIGS. 2A, 2B and 2C are cross sectional views of an exemplary semiconductor structure corresponding to cuts A-A, B-B and C-C shown in FIG. 1, respectively, that can be employed in the present application, the semiconductor structure includes a first semiconductor layer, an etch stop layer, a second semiconductor layer, a third semiconductor layer, a fourth semiconductor layer, and a material stack of alternating sacrificial semiconductor material layers and semiconductor channel material layers.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

In the present application, a semiconductor structure is described and illustrated as containing nanosheet transistors. A transistor (or FET) includes a source region, a drain region, a semiconductor channel region located between the source region and the drain region, and a gate structure located above the semiconductor channel region. Collectively, the source region and the drain region can be referred to as a source/drain region. A nanosheet transistor is a non-planar transistor that includes a vertical stack of spaced apart semiconductor channel material nanosheets as the semiconductor channel region with a pair of source/drain regions located at each of the ends of the vertical stack of spaced apart semiconductor channel material nanosheets. The gate structure includes a gate dielectric and a gate electrode. The gate structure wraps around each of the spaced apart semiconductor channel material nanosheets. In some cases, nanosheets transistors are thus referred to as gate-all-around (GAA) transistors.

In the present application, the semiconductor structure includes a frontside and a backside. The frontside of the semiconductor structure of the present application includes a side of the structure that includes the nanosheet transistors, frontside contact structures, and a frontside BEOL structure. The backside of the semiconductor structure of the present application is the side of the structure that is opposite the frontside. The backside includes a backside contact structure, and a backside interconnect structure.

In conventional nanosheet transistor processes in which a bottom dielectric isolation layer is present beneath the nanosheet transistor, there exists a challenge in controlling the levels of the backside source/drain contact placeholder structure and the source/drain region that is formed above the backside source/drain contact placeholder structure; in such processes a semiconductor buffer layer is typically formed between the backside source/drain contact placeholder structure and the source/drain region. If the backside source/drain contact placeholder structure level is too low such that the semiconductor buffer layer is exposed, there is a high risk of damaging the source/drain region during backside source/drain contact placeholder structure removal. If the backside source/drain contact placeholder structure level is too high such that the semiconductor buffer layer contacts one of the semiconductor channel material nanosheets, it may cause a locally high on-resistance.

In other conventional nanosheet transistor processes in which no bottom dielectric isolation layer is used, the process window is even smaller than instances in which the bottom dielectric isolation layer is used. That is, there is a greater risk of damaging the source/drain region and a greater likelihood of having a high on-resistance when no bottom dielectric isolation layer is employed.

The present application overcomes the processing challenges mentioned above with existing nanosheet transistor device formation processes. In the present application, the risk of damaging the source/drain region during backside source/drain contact placeholder structure removal and having a high on-resistance is mitigated by forming dielectric confinement structures including at least lower inner spacers and a semiconductor pedestal around the backside source/drain contact placeholder structure prior to replacing the placeholder structure with a backside source/drain contact structure. The present application thus provides a semiconductor structure having improved placeholder position margin. These and other aspect of the present application will now be described in greater detail herein below.

In one aspect of the present application, a semiconductor structure is provided. In one embodiment of the present application and as is illustrated, for example, in FIGS. 20A-20C, the semiconductor structure includes a nanosheet transistor including a plurality of spaced apart and vertically stacked semiconductor channel material nanosheets (i.e., semiconductor channel material nanosheets 20NS), a gate structure 42 wrapped around each semiconductor channel material nanosheet 20NS of the plurality of spaced apart and vertically stacked semiconductor channel material nanosheets and a pair of source/drain regions 38. The semiconductor structure further includes upper inner spacers 30 located between each vertically stacked pair of semiconductor channel material nanosheets 20NS of the plurality of spaced apart and vertically stacked semiconductor channel material nanosheets and beneath a bottommost semiconductor channel material nanosheet of the plurality of spaced apart and vertically stacked semiconductor channel material nanosheets, and lower inner spacers 31 located beneath bottommost upper inner spacers 30, wherein each of the lower inner spacers 31 is vertically separated from the bottommost upper inner spacers 30 by a semiconductor pedestal 17P. The semiconductor structure even further includes a backside source/drain contact structure 54 contacting a first source/drain region (e.g., source/drain region 38 to the right of the nanosheet transistor shown in FIG. 20A) of the pair of source/drain regions. In accordance with the present application, the backside source/drain contact structure 54 has a first portion and a second portion, wherein the second portion of the backside source/drain contact structure 54 is confined by the bottommost upper inner spacers 30, the lower inner spacers 31 and the semiconductor pedestal 17P. The presence of the confinement structure mitigates the risk of damaging the source/drain region during backside source/drain contact placeholder structure replacement and having a high on-resistance. Thus, greater placeholder process control is provided.

Figure 20A:
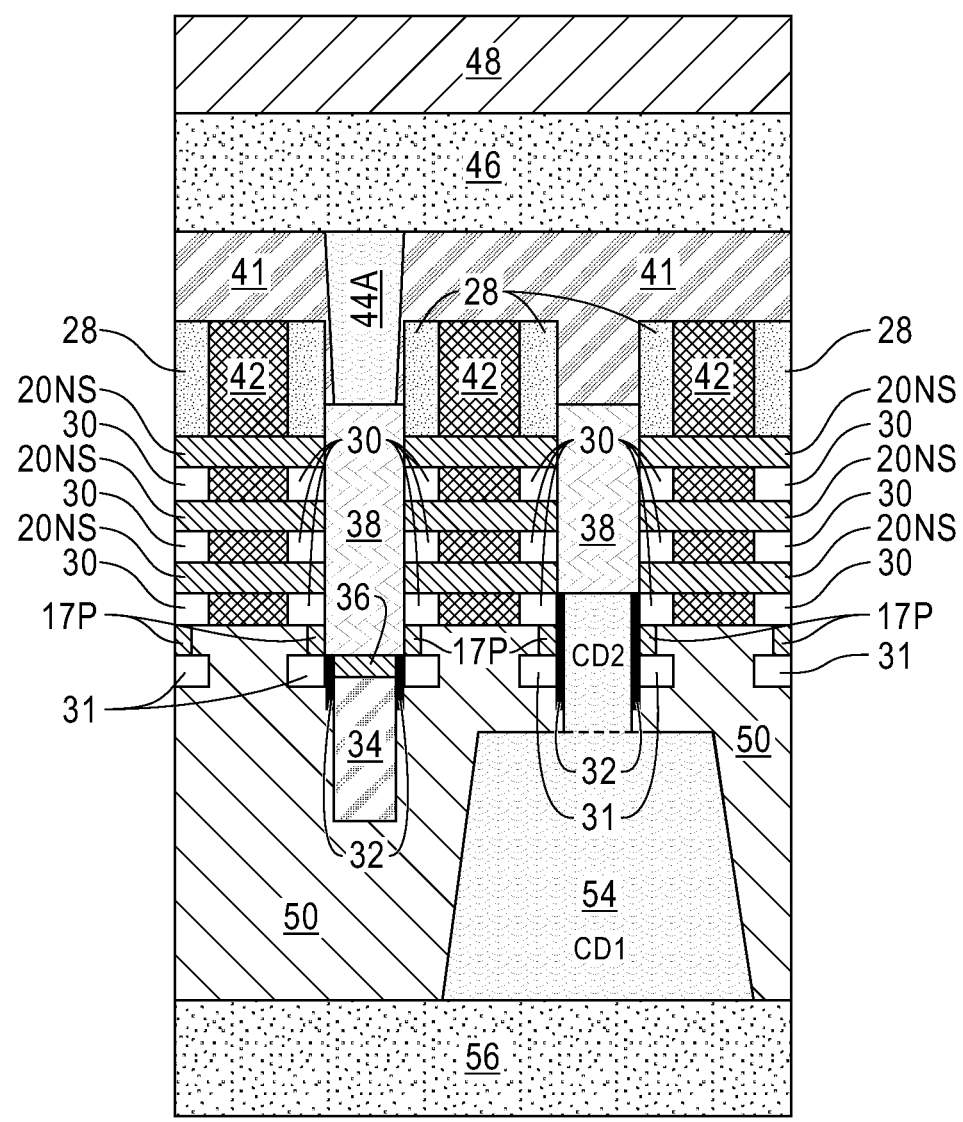
FIGS. 20A, 20B and 20C are cross sectional views of the exemplary semiconductor structure shown in FIGS. 19A, 19B and 19C, respectively, after forming a backside interconnect structure.
Figure 20C:
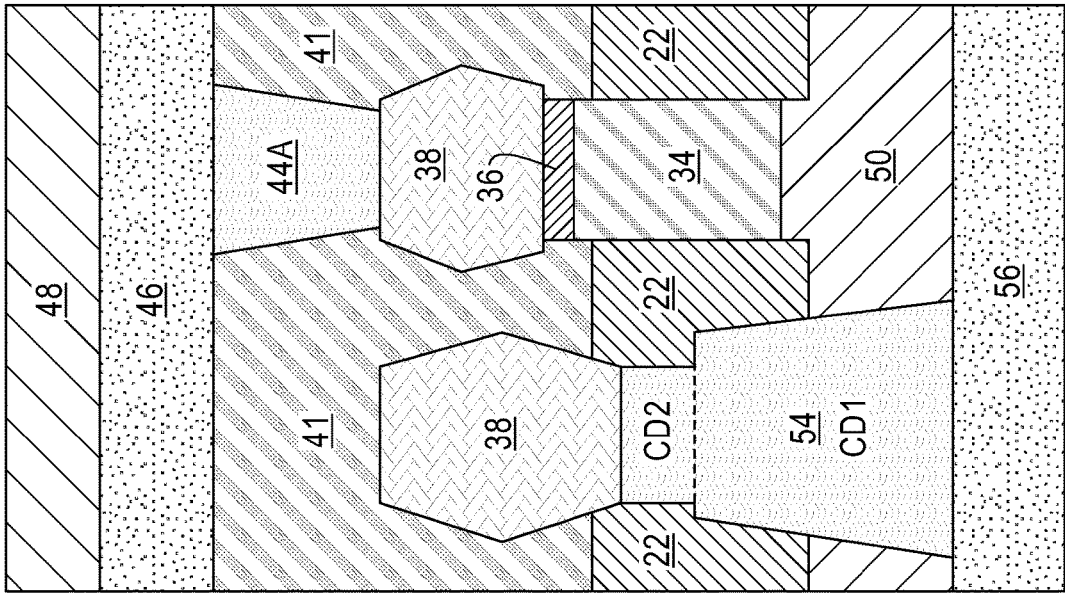
Figure 20C:
Figure 20B:
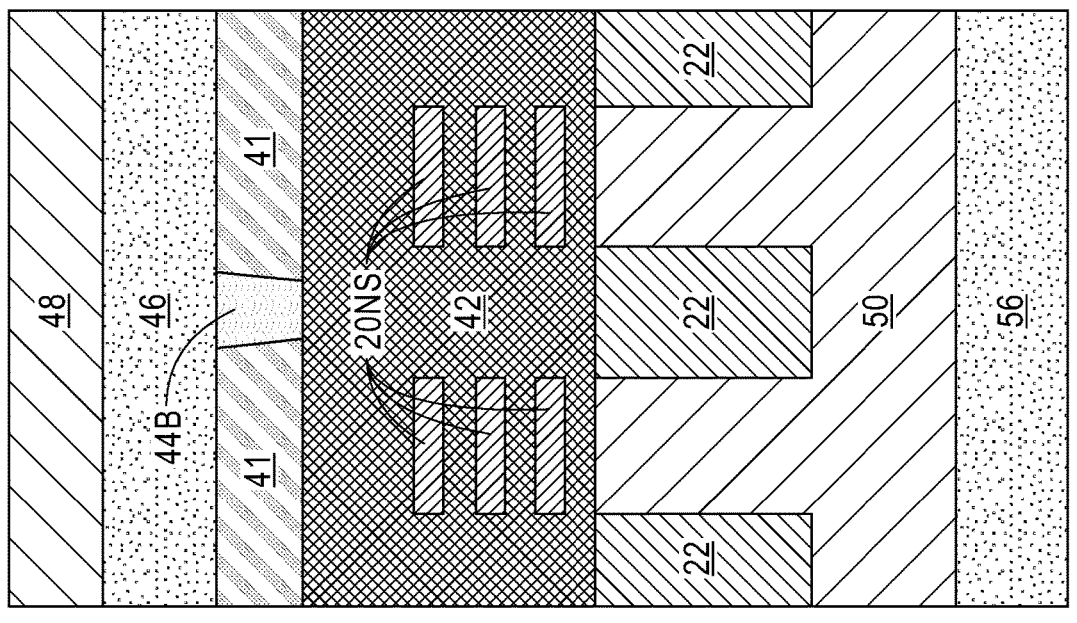

In some embodiments of the present application and as is illustrated in FIGS. 20A-20C, the first portion has a first critical dimension and the second portion has a second critical dimension, wherein the second critical dimension is less than the first critical dimension. The first portion of the backside source/drain contact placeholder structure provides a self-aligned backside contact to the source/drain region of the nanosheet transistor, while the second portion provides a greater contact area to the backside interconnect structure 56.

In some embodiments of the present application and as is illustrated in FIGS. 20A-20C, the semiconductor structure can further include protective liner 32 separating the second portion of the backside source/drain contact structure 54 from the bottommost upper inner spacers 30, the lower inner spacers 31 and the semiconductor pedestal 17P. The protective liner 32 adds a further confinement structure that even further mitigates the risk of damaging the source/drain region during backside second semiconductor layer 14 removal and the risk of having a high on-resistance. Thus, greater placeholder process control is provided.

In some embodiments of the present application and as is illustrated in FIGS. 20A-20C, the protective liner 32 contacts a surface of the first source/drain region that is in contact with the backside source/drain contact structure 54.

In some embodiments of the present application and as is illustrated in FIGS. 20A-20C, a second source/drain region (source/drain region 38 to the left of the middle nanosheet transistor shown in FIG. 20A) of the pair of source/drain regions is located on semiconductor buffer layer 36. The semiconductor buffer layer 36 is employed to form more robust source/drain regions.

In some embodiments of the present application and as is illustrated in FIGS. 20A-20C, the semiconductor buffer layer 36 is located on a surface of backside source/drain contact placeholder structure 34.

In some embodiments of the present application and as is illustrated in FIGS. 20A-20C, protective liner 32 is located on a sidewall of semiconductor buffer layer 36 and a sidewall of the backside source/drain contact placeholder structure 34. In such embodiments, the protective liner 32 separates the semiconductor buffer layer 36 and the backside source/drain contact placeholder structure 34 from the lower inner spacers 31. In such embodiments, the protective liner 32 contacts a surface of the second source/drain region (i.e., source/drain region 38 to the left of the middle nanosheet transistor shown in FIG. 20A) of the pair of source/drain regions.

In some embodiments of the present application and as is illustrated in FIGS. 20A-20C, one of the semiconductor pedestals 17P contacts a sidewall of the second source/drain region (source/drain region 38 to the left of the middle nanosheet transistor shown in FIG. 20A).

In some embodiments of the present application and as is illustrated in FIGS. 20A-20C, the second source/drain region (source/drain region 38 to the left of the middle nanosheet transistor shown in FIG. 20A) of the pair of source/drain regions has a vertical height that differs from a vertical height of the first source/drain region (source/drain region 38 to the right of the middle nanosheet transistor shown in FIG. 20A) that contacts the backside source/drain contact structure 54. This illustrates that the present application can tolerate different placeholder position margins while still mitigating the risk of damaging the source/drain region during backside second semiconductor layer 14 removal and the risk of having a high on-resistance.

In some embodiments of the present application and as is illustrated in FIGS. 20A-20C, the semiconductor structure can further include frontside source/drain contact structure 44A contacting the second source/drain region (source/drain region 38 to the left of the middle nanosheet transistor shown in FIG. 20A) of the pair of source/drain regions. This connection connects the nanosheet transistor to the frontside BEOL structure 46.

In some embodiments of the present application and as is illustrated in FIGS. 20A-20C, the semiconductor structure can further include frontside BEOL structure 46 contacting the frontside source/drain contact structure 44A.

In some embodiments of the present application and as is illustrated in FIG. 20B, the semiconductor structure can further include frontside gate contact structure 44B having a first surface contacting a gate electrode of the gate structure 42 of the nanosheet transistor and a second surface opposite the first surface that contacts the frontside BEOL structure 46. This connection connects the gate structure of the nanosheet transistor to the frontside BEOL structure 46.

In some embodiments of the present application and as is illustrated in FIGS. 20A-20C, the semiconductor structure can further include backside interconnect structure 56 contacting a surface of the backside source/drain contact structure 54.

In some embodiments of the present application and as is illustrated in FIGS. 20A-20C, semiconductor pedestal 17P has a width that is less than a width of the upper inner spacers 30 and a width of the lower inner spacers 31.

In some embodiments of the present application and as is illustrated in FIGS. 20A-20C, the semiconductor structure can further include backside ILD layer 50 located beneath the nanosheet transistor and surrounding the backside source/drain contact structure 54.

In some embodiments of the present application and as is illustrated in FIGS. 20A-20C, the backside ILD layer 50 contacts sidewalls of both the semiconductor pedestal 17P and the lower inner spacers 31.

In some embodiments of the present application and as is illustrated in FIGS. 20A-20C, the backside ILD layer 50 further contacts surfaces of both the bottommost upper inner spacers 30 and a bottommost portion of the gate structure 42.

In some embodiments of the present application and as is illustrated in FIG. 20C, the structure further includes shallow trench isolation structure 22 located adjacent to the backside source/drain contact structure 54. In such embodiments, the semiconductor structure of the present application can further include backside source/drain contact placeholder structure 34 laterally adjacent to the shallow trench isolation structure 22, wherein semiconductor buffer layer 36 is located on the backside source/drain contact placeholder structure 34 and a second source/drain region of the pair of source/drain regions is located on the semiconductor buffer layer 36.

Figure 1:
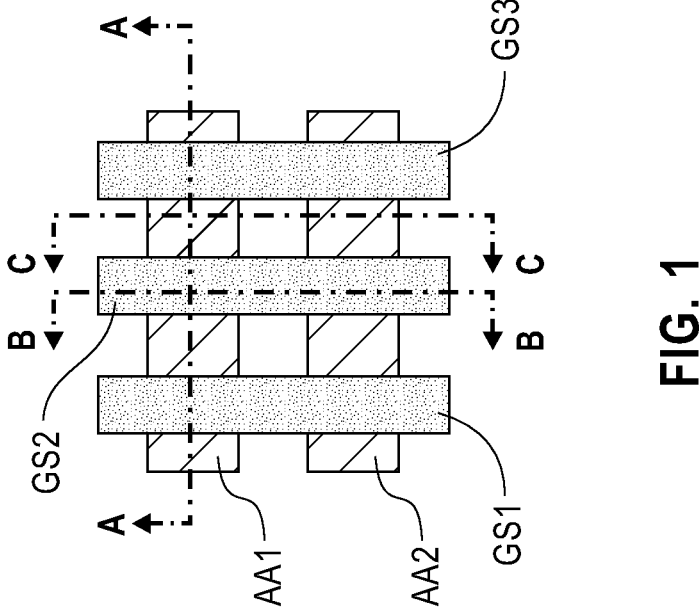
FIG. 1 is a top-down view of an exemplary semiconductor device layout that can be employed in accordance with an embodiment of the present application, the semiconductor device layout includes a plurality of active areas oriented along a first direction, and a plurality of functional gate structures that are oriented in a second direction which is perpendicular to the first direction; in the drawing cut A-A, cut B-B and cut C-C are shown.

Reference is now made to FIG. 1 which illustrates an exemplary semiconductor device layout that can be employed in accordance with an embodiment of the present application. The semiconductor device layout includes a plurality of active areas, AA, oriented along a first direction, and a plurality of functional gate structures, e.g., GS1, GS2 and GS3, that are oriented in a second direction which is perpendicular to the first direction; in the drawing cut A-A, cut B-B and cut C-C are shown. By way of an example, three functional gate structures, GS1, GS2 and GS3, and two active areas, AA1 and AA2, are shown. Cut A-A is through a length-wise direction of one of the active areas, e.g., AA1 and through each of GS1, GS2 and GS3, cut B-B is through a length-wise direction of one of the gate structures, e.g., GS2, and through two active areas, AA1 and AA2, and cut C-C is located in between two neighboring gate structures, e.g., GS2 and GS3, and it passes through source/drain (S/D) regions of the two neighboring gate structures and spans through two active areas, AA1 and AA2. In the present application, each of FIGS. 2A, 3A, . . . 20A is through cut A-A, while each of FIGS. 2B, 3B, . . . 20B is through cut B-B, and each of FIGS. 2C, 3C, . . . 20C is through cut C-C.

Figures 2B, 2C:
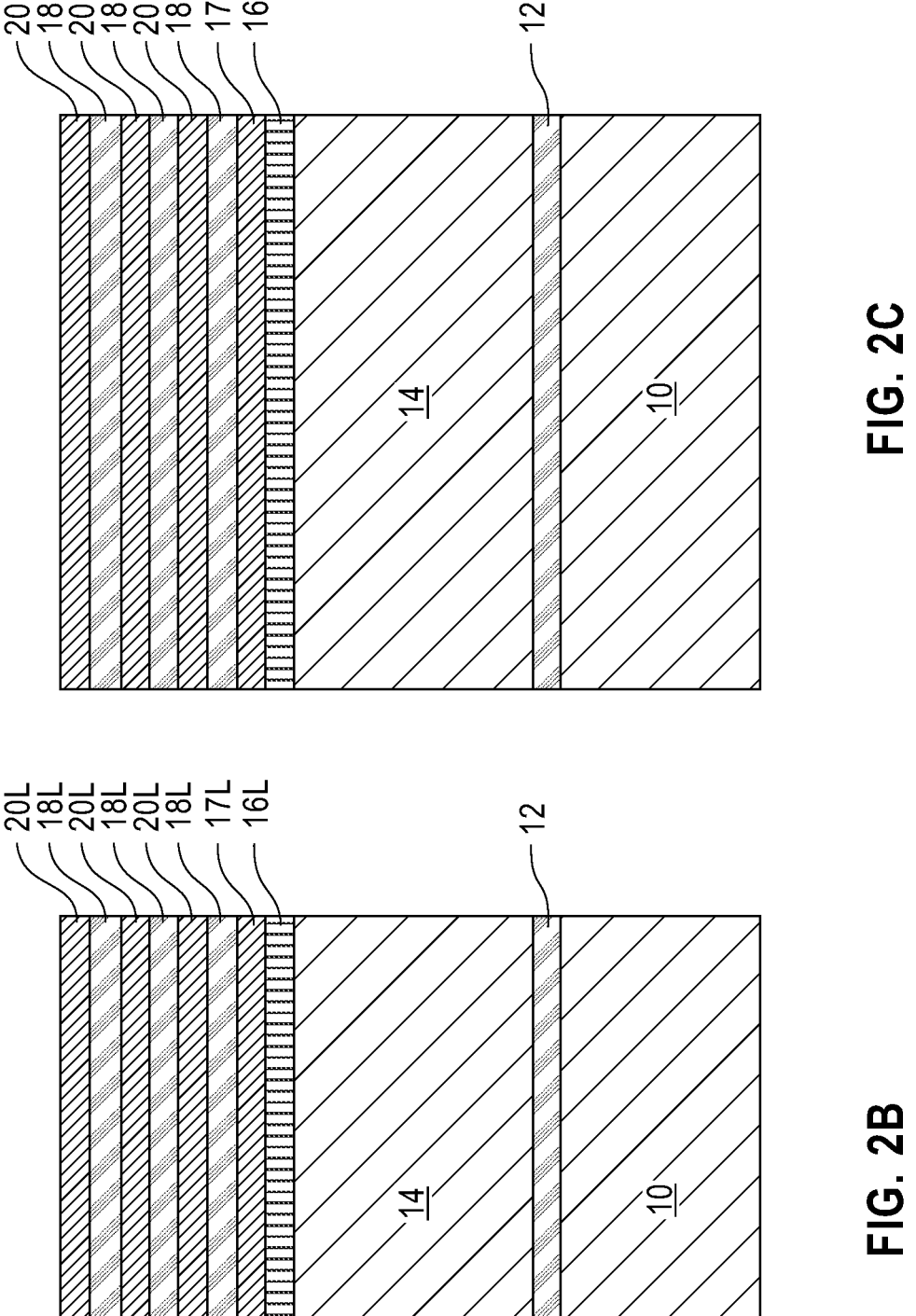

Referring now to FIGS. 2A, 2B and 2C, there are illustrated an exemplary semiconductor structure corresponding to cuts A-A, B-B and C-C shown in FIG. 1, respectively, that can be employed in the present application. The illustrated semiconductor structure includes a first semiconductor layer 10, an etch stop layer 12, a second semiconductor layer 14, a third semiconductor layer 16L, a fourth semiconductor layer 17L, and a material stack of alternating sacrificial semiconductor material layers 18L and semiconductor channel material layers 20L. It is noted that the third semiconductor layer 16L is a sacrificial layer that is removed later in the process of the present application, and that the fourth semiconductor layer 17L is not used as a semiconductor channel material.

In the present application, the first semiconductor layer 10, the etch stop layer 12 and the second semiconductor layer 14 can be components of a substrate. The first semiconductor layer 10 is composed of a first semiconductor material, and the second semiconductor layer 14 is composed of a second semiconductor material. The term "semiconductor material" is used throughout the present application to denote a material having semiconducting properties. Examples of semiconductor materials that can be used in the present application in providing the first semiconductor material and the second semiconductor material include, but are not limited to, silicon (Si), a silicon germanium (SiGe) alloy, a silicon germanium carbide (SiGeC) alloy, germanium (Ge), III/V compound semiconductors or II/VI compound semiconductors. The second semiconductor material that provides the second semiconductor layer 14 can be compositionally the same as, or compositionally different from, the first semiconductor material that provides the first semiconductor layer 10.

In some embodiments of the present application, the etch stop layer 12 can be composed of a dielectric material such as, for example, silicon dioxide and/or boron nitride. In other embodiments of the present application, the etch stop layer 12 is composed of a semiconductor material that is compositionally different from the first semiconductor material that provides the first semiconductor layer 10 and the second semiconductor material that provides the second semiconductor layer 14. In one example, the first semiconductor layer 10 is composed of silicon, the etch stop layer 12 is composed of silicon dioxide, and the second semiconductor layer 14 is composed of silicon. In another example, the first semiconductor layer 10 is composed of silicon, the etch stop layer 12 is composed of silicon germanium, and the second semiconductor layer 14 is composed of silicon.

The substrate including the first semiconductor layer 10, the etch stop layer 12 and the second semiconductor layer 14 can be formed utilizing techniques well known to those skilled in the art. For example, the substrate including the first semiconductor layer 10, the etch stop layer 12 and the second semiconductor layer 14 can be formed by a separation by ion implantation of oxygen process, or wafer bonding. Alternatively, the substrate including the first semiconductor layer 10, the etch stop layer 12 and the second semiconductor layer 14 can be formed by deposition of the various substrate layers one on top the other. The deposition used in forming the various substrate layers can include, but is not limited to, chemical vapor deposition (CVD), plasma enhanced chemical vapor deposition (PECVD), or epitaxial growth. The terms "epitaxial growth" or "epitaxially growing" means the growth of a semiconductor material on a growth surface of another semiconductor material, in which the semiconductor material being grown has the same crystalline characteristics as the growth surface of the another semiconductor material. In an epitaxial deposition process, the chemical reactants provided by the source gases are controlled and the system parameters are set so that the depositing atoms arrive at the growth surface of the another semiconductor material with sufficient energy to move around on the growth surface and orient themselves to the crystal arrangement of the atoms of the growth surface. Examples of various epitaxial growth process apparatuses that can be employed in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from 550° C. to 900° C. Although higher temperature typically results in faster deposition, the faster deposition may result in crystal defects and film cracking.

The third semiconductor layer 16L is composed of a third semiconductor material, while the fourth semiconductor layer 17L is composed of a fourth semiconductor material. In the present application, the third semiconductor material that provides the third semiconductor layer 16L is compositionally different from the second semiconductor material that provides the second semiconductor layer 14 and the fourth semiconductor material that provides the fourth semiconductor layer 17L. In one embodiment, the third semiconductor layer 16L is composed of a silicon germanium alloy having a germanium content of from 40 atomic percent to 75 atomic percent, and the fourth semiconductor layer 17L is composed silicon. Typically, the third semiconductor layer 16L has a thickness from 5 nm to 20 nm and the fourth semiconductor layer has a thickness from 5 nm to 20 nm; although other thicknesses are contemplated and can be employed as the thickness of the third semiconductor layer 16L and the fourth semiconductor layer 17. The third semiconductor layer 16L and the fourth semiconductor layer 17L are formed utilizing one of the deposition processes mentioned above in forming the various substrate layers, i.e., CVD, PECVD or epitaxial growth.

As mentioned above, the material stack includes alternating sacrificial semiconductor material layers 18L and semiconductor channel material layers 20L. In some embodiments and as is illustrated in FIGS. 2A, 2B and 2C, there is an equal number of sacrificial semiconductor material layers 18L and semiconductor channel material layers 20L. That is, the material stack can include 'n' number of semiconductor channel material layers 20L and 'n' number of sacrificial semiconductor material layers 18L, wherein n is an integer greater than one. By way of one example, the material stack includes three sacrificial semiconductor material layers 18L and three semiconductor channel material layers 20L. Each sacrificial semiconductor material layer 18L is composed of a fifth semiconductor material, while each semiconductor channel material layer 20L is composed of a sixth semiconductor material that is compositionally different from the fifth semiconductor material; note that the fifth and sixth semiconductor materials are both compositionally different from the third semiconductor material that provides the third semiconductor layer 16L.

In some embodiments, the sixth semiconductor material that provides each semiconductor channel material layer 20L can provide high channel mobility for n-type field effect transistor (FET) devices. In other embodiments, the sixth semiconductor material that provides each semiconductor channel material layer 20L can provide high channel mobility for p-type FET devices. The fifth semiconductor material that provides each sacrificial semiconductor material layer 18L, and the sixth semiconductor material that provides each semiconductor channel material layer 20L can include one of the semiconductor materials mentioned above. In one example, each sacrificial semiconductor material layer 18L is composed of a silicon germanium alloy having a germanium content from 20 atomic percent to 40 atomic percent (note that each sacrificial semiconductor material layer 18L is compositionally different from the third semiconductor material mentioned above), and the sixth semiconductor material that provides each semiconductor channel material layer 20L is composed of silicon. Other combinations of semiconductor materials are possible as long as the fifth semiconductor material that provides each sacrificial semiconductor material layer 18L is compositionally different from the sixth semiconductor material that provides each semiconductor channel material layer 20L, and that the fifth semiconductor material that provides the sacrificial semiconductor material layers 18L and the sixth semiconductor material that provides the semiconductor channel material layers 20L are compositionally different from the third semiconductor material that provides the third semiconductor layer 16L.

Each sacrificial semiconductor material layer 18L can have a first thickness, and each semiconductor channel material layer 20L can have a second thickness. In the present application, the first thickness can be equal to, greater than, or less than, the second thickness. The material stack including the alternating sacrificial semiconductor material layers 18L and semiconductor channel material layers 20L can be formed by CVD, PECVD, epitaxial growth or any combination of such deposition processes.

Figure 3A:
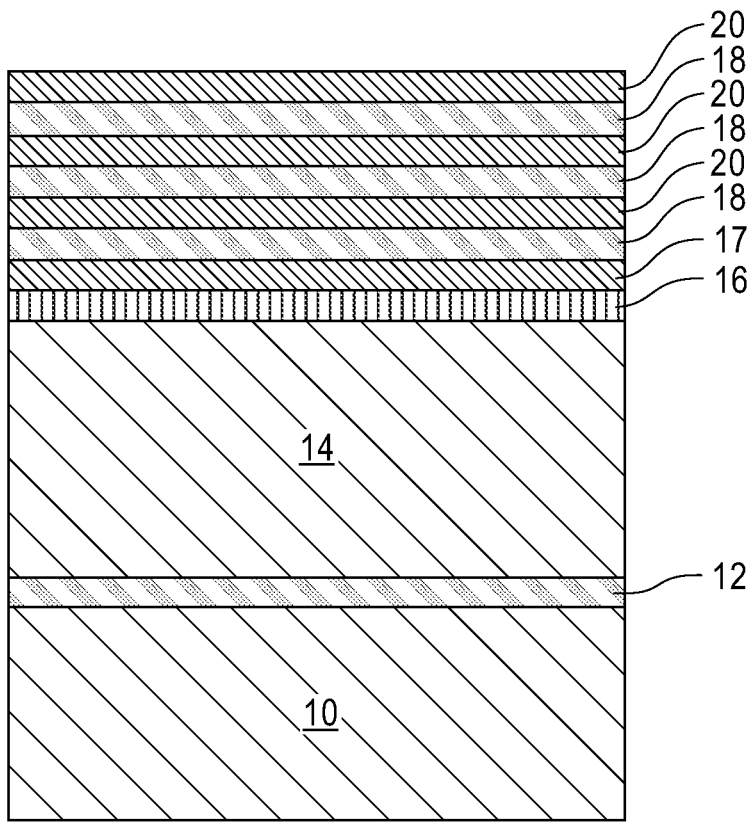
FIGS. 3A, 3B and 3C are cross sectional views of the exemplary semiconductor structure shown in FIGS. 2A, 2B and 2C, respectively, after patterning the material stack, the fourth semiconductor layer, the third semiconductor layer and the second semiconductor layer, and forming a shallow trench isolation structure.
Figures 3B, 3C:
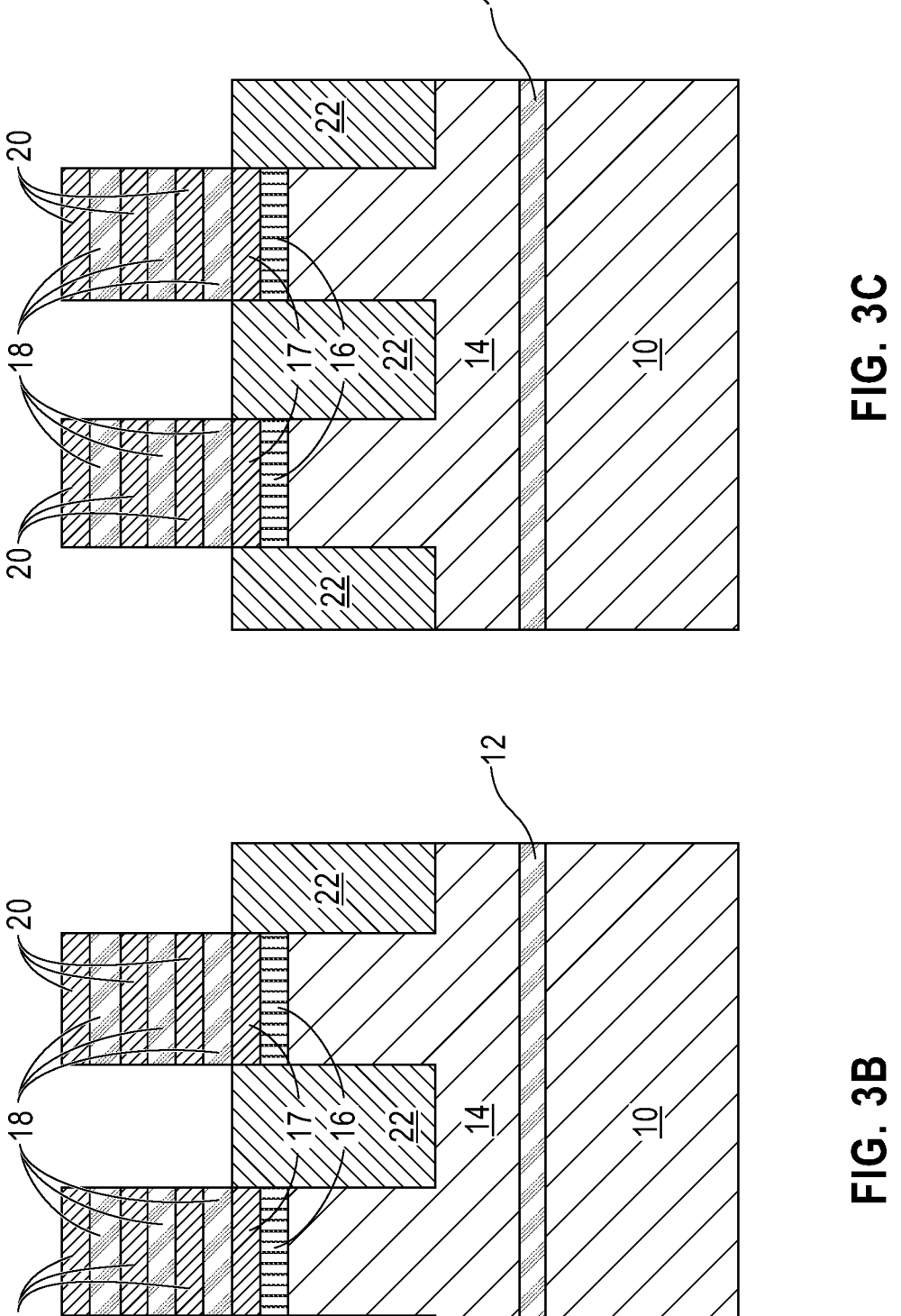

Referring now to FIGS. 3A, 3B and 3C, there are illustrated the exemplary semiconductor structure shown in FIGS. 2A, 2B and 2C, respectively, after patterning the material stack, the fourth semiconductor layer 17L, the third semiconductor layer 16L and the second semiconductor layer 14 and forming a shallow trench isolation structure 22. The patterning of the material stack, the fourth semiconductor layer 17L, the third semiconductor layer 16L and the second semiconductor layer 14 includes lithography and etching. Lithography includes forming a photoresist material on a layer or a stack of layers that need to be patterned, exposing the photoresist material to a pattern of irradiation, and developing the exposed photoresist material. The etch can include reactive ion etching (RIE), ion beam etching (IBE), plasma etching or any combination thereof. This etch etches through an entirety of the material stack, the fourth semiconductor layer 17L, and the third semiconductor layer 16L and partially into the second semiconductor layer 14. This etch stop on a sub-surface of the second semiconductor layer 14. The term "sub-surface" denotes a surface of a material layer that is located between a topmost surface of the material layer and a bottommost surface of the material layer. After etching the remaining photoresist material can be removed utilizing a conventional photoresist removal process.

After this first patterning process, at least one patterned material stack is formed. In the illustrated example, and as shown in FIG. 3B, two patterned material stacks are formed. Each patterned material structure includes a remaining (i.e., non-etched) portion of each sacrificial semiconductor layer 18L and a remaining (i.e., non-etched) portion of each semiconductor channel material layer 20L. In the present application, each remaining (i.e., non-etched) portion of sacrificial semiconductor layers 18L within the patterned material stack can be referred to a patterned sacrificial semiconductor layer 18, while each remaining (i.e., non-etched) portion of semiconductor channel material layer 20L within the patterned material stack can be referred to a patterned semiconductor channel material layer 20. In the present application, and as is shown in FIG. 3B, each patterned sacrificial semiconductor layer 18 has a same width as each patterned semiconductor channel material layer 20.

The at least one patterned material stack is located on a remaining (i.e., non-etched) portion of the fourth semiconductor layer 17L. In the present application, the remaining (i.e., non-etched) portion of the fourth semiconductor layer 17L under each patterned material stack can be referred to a patterned fourth semiconductor layer 17. In the present application, the patterned fourth semiconductor layer 17 that is located under any given patterned material stack has a same width as the width of each patterned sacrificial semiconductor layer 18 and each patterned semiconductor channel material layer 20.

Each patterned fourth semiconductor layer 17 is located on a remaining (i.e., non-etched) portion of the third semiconductor layer 16L. In the present application, the remaining (i.e., non-etched) portion of the third semiconductor layer 16L under each patterned material stack can be referred to a patterned third semiconductor layer 16. In the present application, the patterned third semiconductor layer 16 located under any given patterned material stack has a same width as the width of the overlying fourth semiconductor layer 17, each patterned sacrificial semiconductor layer 18 and each patterned semiconductor channel material layer 20. The patterned third semiconductor layer 16 is located on a non-etched mesa portion of the second semiconductor layer 14.

Shallow trench isolation structure 22 can be formed on the physically exposed sub-surface of the second semiconductor layer 14 and along sidewalls of the patterned third semiconductor layer 16 and the patterned fourth semiconductor layer 17. The shallow trench isolation structure 22 is composed of any trench dielectric material such as, for example, silicon oxide. In some embodiments, a trench dielectric liner composed of, for example, SiN, can be present along a sidewall and a bottom wall of the trench dielectric material. The shallow trench isolation structure 22 has a topmost surface that is coplanar with, or slightly below, a topmost surface of the patterned fourth semiconductor layer 17. The shallow trench isolation structure 22 can be formed by depositing the optional trench dielectric liner material and the trench dielectric material in the trench, and thereafter performing an etch back process.

Figure 4A:
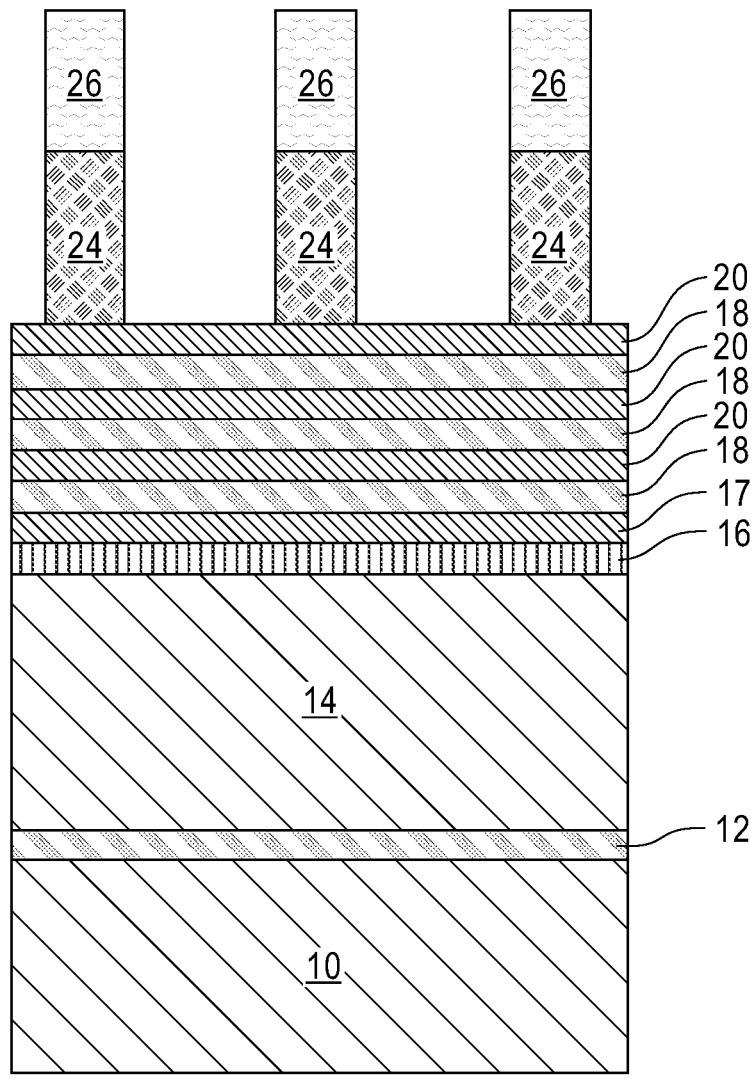
FIGS. 4A, 4B and 4C are cross sectional views of the exemplary semiconductor structure shown in FIGS. 3A, 3B and 3C, respectively, after forming a sacrificial gate structure and a hard mask cap.
Figure 4C:
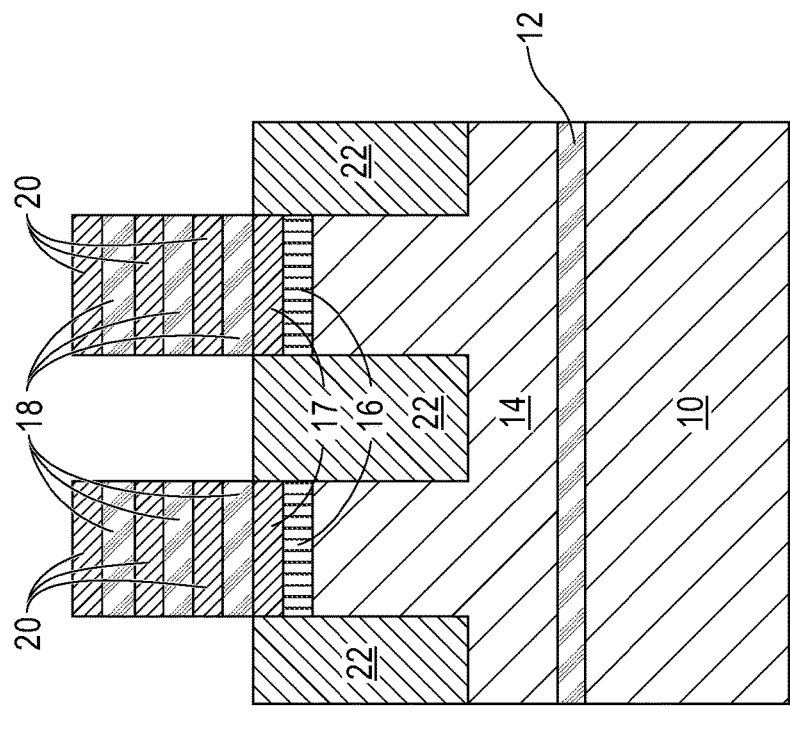
Figure 4B:
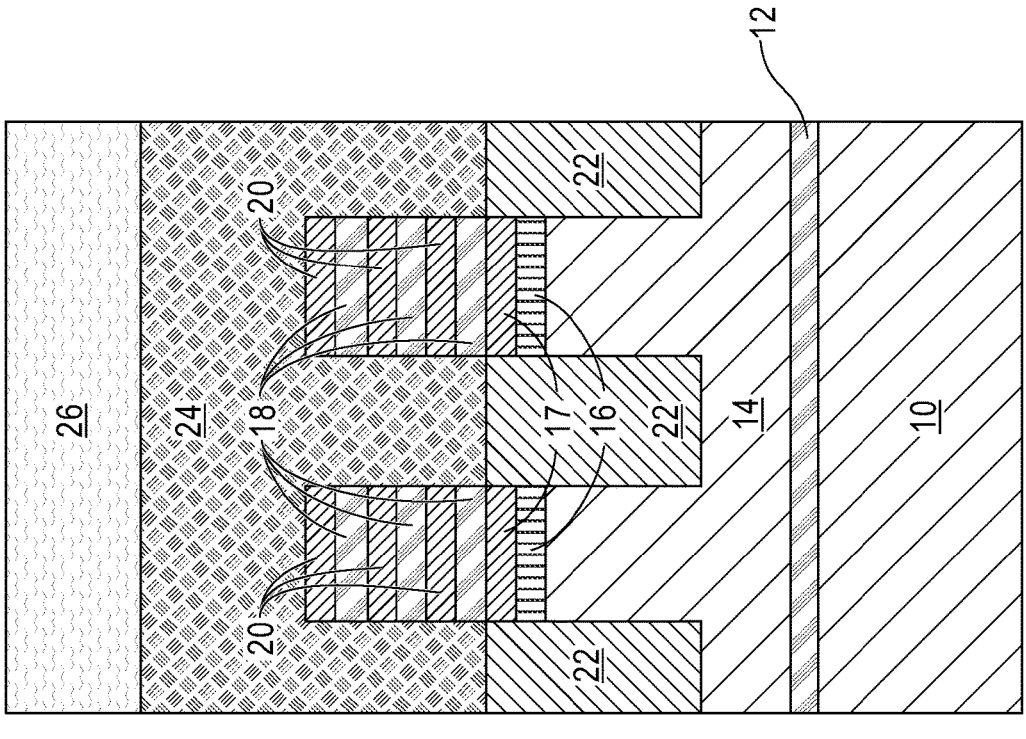

Referring now to FIGS. 4A, 4B and 4C, there are illustrated the exemplary semiconductor structure shown in FIGS. 3A, 3B and 3C, respectively, after forming a sacrificial gate structure 24 and a hard mask cap 26. In some embodiments, the hard mask cap 26 can be omitted from the structure. In the illustrated embodiment, three sacrificial gate structures 24 are shown in FIG. 4A and each sacrificial gate structure 24 straddles over at least one of the patterned material stacks. The term "straddle" denotes that one material layer is located on a topmost surface and opposing sidewall surfaces of another material layer; the straddling aspect is shown in FIG. 4B in which the sacrificial gate structure 24 is located on top, and along sidewalls, of each patterned material stack.

The sacrificial gate structure 24 includes at least a sacrificial gate material. In some embodiments, the sacrificial gate structure 24 can also include a sacrificial gate dielectric material. In such embodiments, the sacrificial gate dielectric material would be located beneath the sacrificial gate material. The optional sacrificial gate dielectric material can be composed of a dielectric material such as, for example, silicon dioxide. The sacrificial gate material can be composed of, for example, polysilicon, amorphous silicon, amorphous silicon germanium or amorphous germanium. The hard mask cap 26 is composed of a hard mask material such as, for example, silicon nitride.

The sacrificial gate structure 24 and if present, the hard mask cap 26 can be formed by depositing the optional sacrificial gate dielectric material, depositing the sacrificial gate material and, depositing, if the hard mask cap 26 is present, the hard mask material and thereafter subjecting the as-deposited material layers to a patterning process. Patterning includes lithography and etching as defined above Referring now to FIGS. 5A, 5B and 5C, there are shown the exemplary semiconductor structure shown in FIGS. 4A, 4B and 4C, respectively, after forming gate spacers 28, and nanosheet patterning of the previously patterned material stack, previously patterned fourth semiconductor layer 17, and previously patterned third semiconductor layer 16, wherein the nanosheet patterning of the previously patterned material stack forms at least one nanosheet stack of alternating sacrificial semiconductor material nanosheets 18NS and semiconductor channel material nanosheets 20NS, that are located on a twice patterned fourth semiconductor layer 17L, and a twice patterned third semiconductor layer 16L. It is noted that the second semiconductor layer 14 can be slightly recessed during the nanosheet patterning process. The twice patterned fourth semiconductor layer 17L can be referred to herein as a fourth semiconductor nanosheet 17NS, and the twice patterned third semiconductor layer 16L can be referred to as a third semiconductor nanosheet 16NS. The 'fourth' and 'third' designations are used to denote which semiconductor layer the third semiconductor nanosheet 16NS and the fourth semiconductor nanosheet 17NS are derived from.

Gate spacer 28, which is present along a sidewall of the sacrificial gate structure 24 and, if present, the hard mask cap 26, can be composed of a dielectric spacer material including, but not limited to, silicon dioxide, SiN, SiBCN, SiOCN or SiOC. The gate spacer 28 can be formed by deposition of the dielectric spacer material, followed by a spacer etch.

Next, nanosheet patterning is performed after gate spacer 28 formation. Nanosheet patterning utilizes the sacrificial gate structure 24, if present, the hard mask cap 26 and the gate spacer 28 that is present along at least the sidewalls of at least the sacrificial gate structure 24 as a combined etch mask. An etch such as, for example, RIE, is then employed to remove portions of the patterned material stack, the patterned fourth semiconductor layer 17 and the patterned third semiconductor layer 16 that are not protected by the combined etch mask. Immediately after nanosheet patterning, the sacrificial semiconductor material nanosheets 18NS, the semiconductor channel material nanosheets 20NS, the third semiconductor nanosheets 16NS and the fourth semiconductor nanosheets 17NS have a same width. The etch used during the nanosheet patterning can slightly recess portions of the second semiconductor layer 14 that are located at the footprint of each stack containing, from bottom to top, the third semiconductor nanosheet 16NS, the fourth semiconductor nanosheet 17NS and the nanosheet stack of alternating sacrificial semiconductor material nanosheets 18NS and semiconductor channel material nanosheets; see, for example, FIGS. 5A and 5C.

Figure 5A:
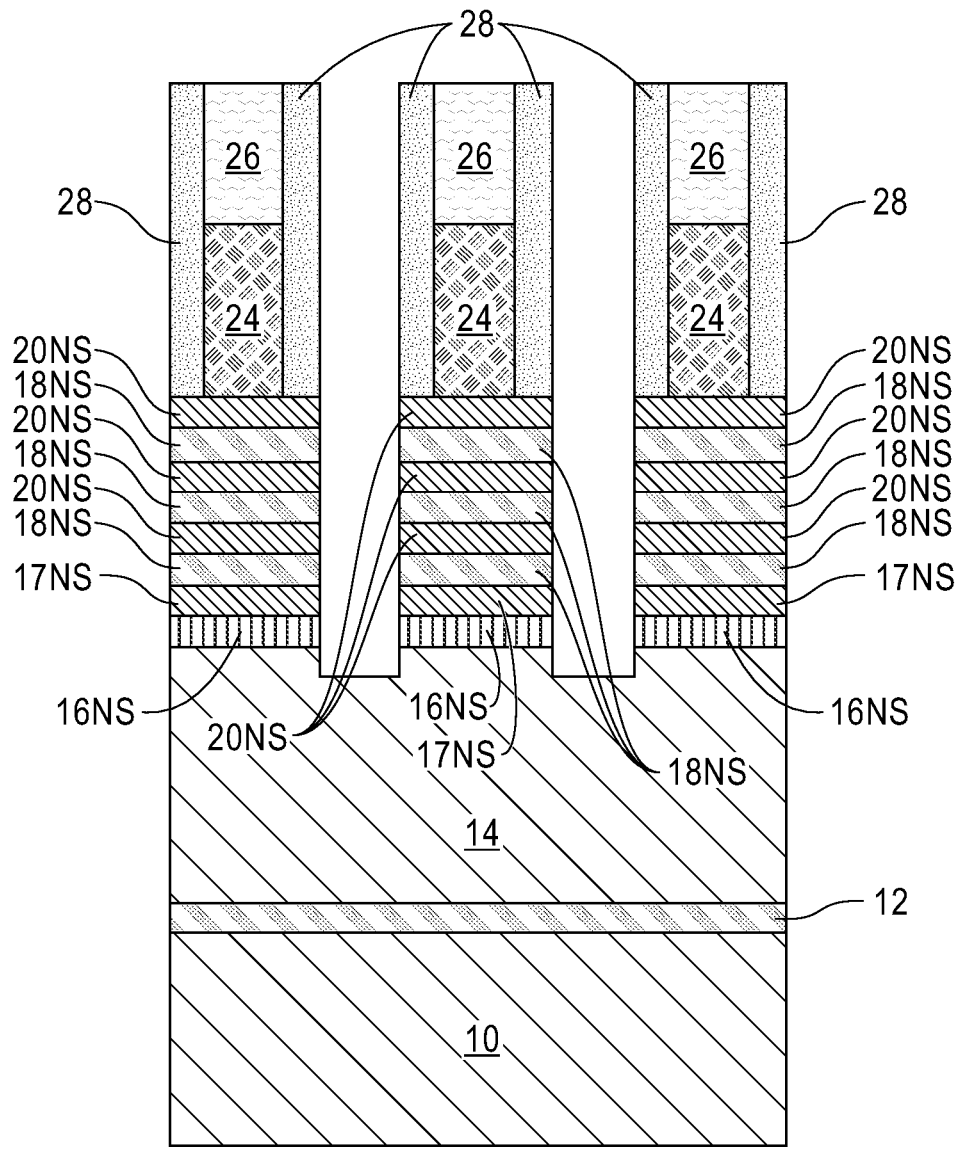
FIGS. 5A, 5B and 5C are cross sectional views of the exemplary semiconductor structure shown in FIGS. 4A, 4B and 4C, respectively, after forming gate spacers, and nanosheet patterning of the previously patterned material stack, previously patterned fourth semiconductor layer, and previously patterned third semiconductor layer, wherein the nanosheet patterning of the previously patterned material stack forms at least one nanosheet stack of alternating sacrificial semiconductor material nanosheets and semiconductor channel material nanosheets, that are located on a twice patterned fourth semiconductor layer, and a twice patterned third semiconductor layer.
Figure 5C:
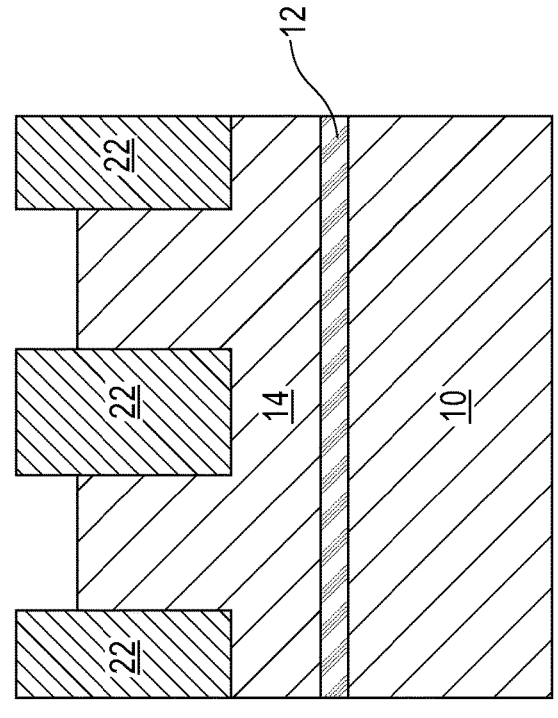
Figure 5B:
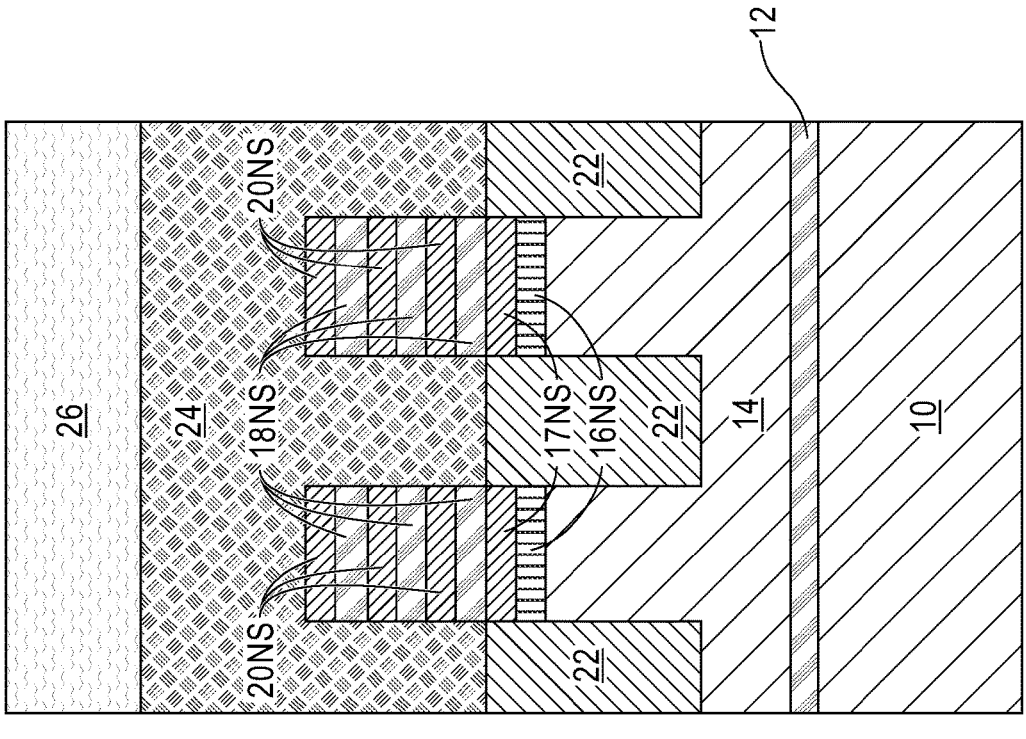
Figure 6A:
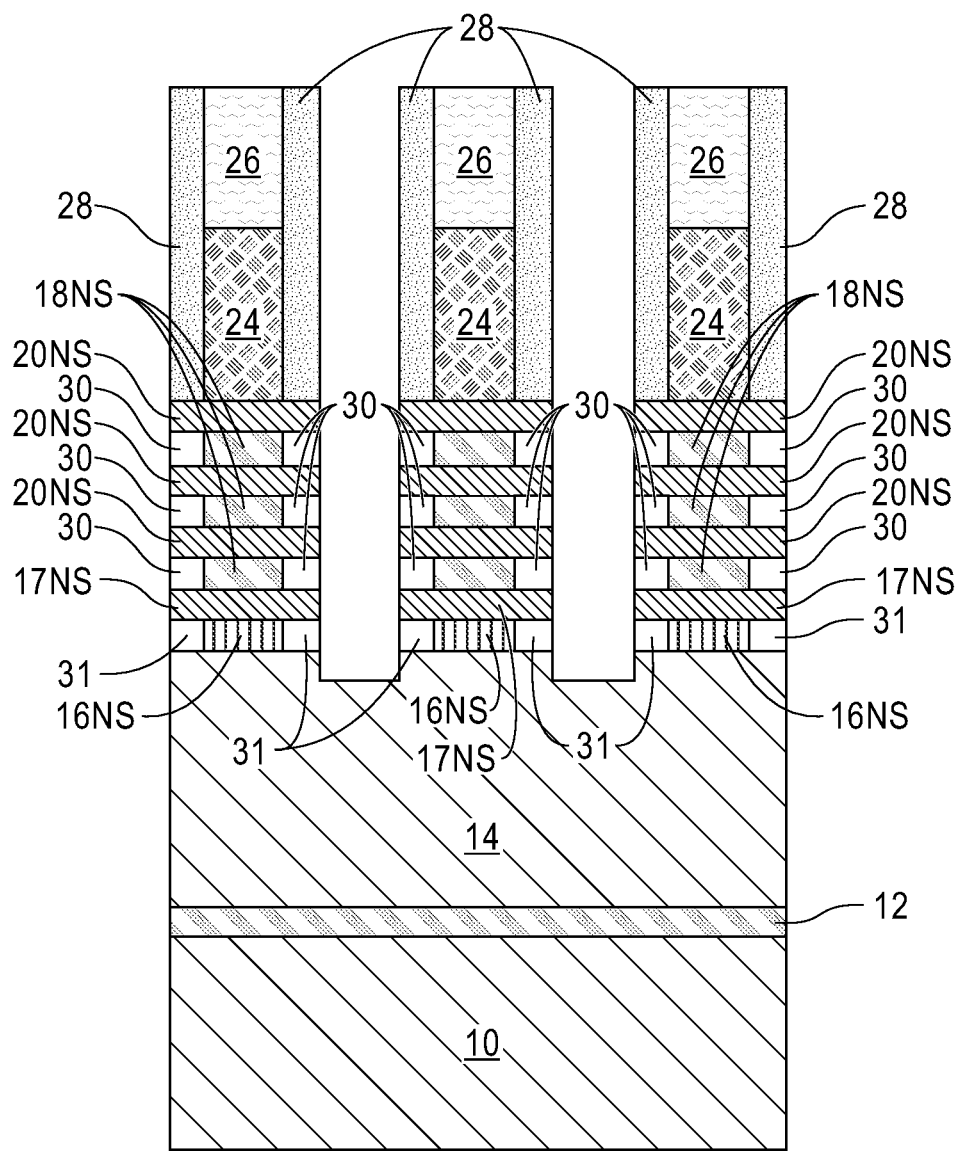
FIGS. 6A, 6B and 6C are cross sectional views of the exemplary semiconductor structure shown in FIGS. 5A, 5B and 5C, respectively, after indenting each sacrificial semiconductor material nanosheet and the twice patterned third semiconductor layer, and forming inner spacers.
Figure 6C:
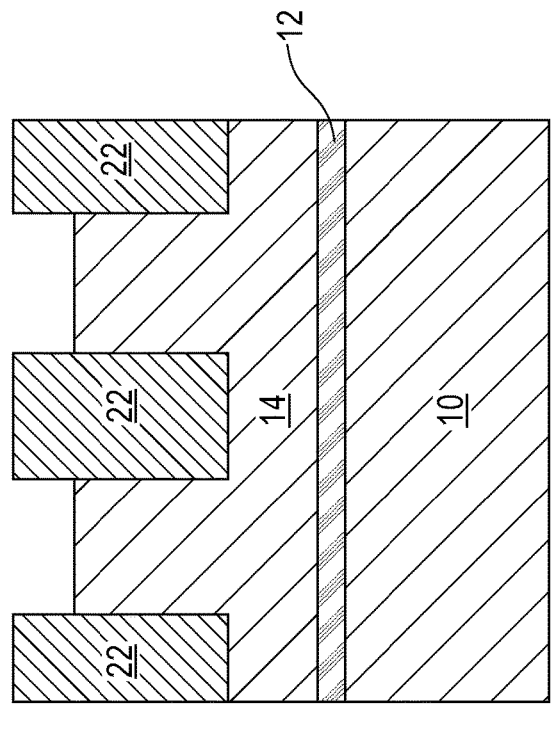
Figure 6B:
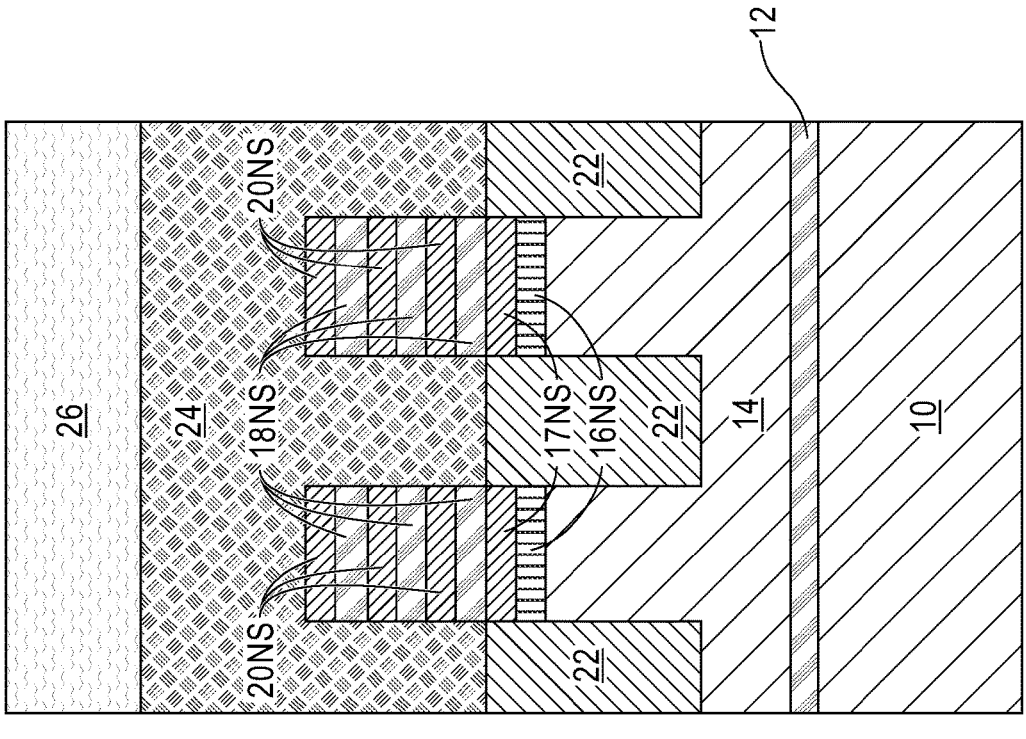

Referring now to FIGS. 6A, 6B and 6C, there are illustrated the exemplary semiconductor structure shown in FIGS. 5A, 5B and 5C, respectively, after indenting each sacrificial semiconductor material nanosheet 18NS and the twice patterned third semiconductor layer (i.e., the third semiconductor nanosheet 16NS), and forming inner spacers. Notably, upper inner spacers 30 are formed laterally adjacent to each indented sacrificial semiconductor material nanosheet, and a lower inner spacer 31 is formed laterally adjacent to the indented third semiconductor nanosheet 16NS.

The indenting includes a lateral etching process that removes end portions of each sacrificial semiconductor material nanosheet 18NS and each third semiconductor nanosheet 16NS. This lateral etch does not indent the semiconductor channel material nanosheets 20NS or the fourth semiconductor nanosheet 17NS. The upper inner spacers 30 and the lower inner spacers 31 are composed of one of the dielectric spacer materials mentioned above for the gate spacers 28. The upper inner spacers 30 and the lower inner spacers 31 are composed of same dielectric spacer material. The upper inner spacers 30, and the lower inner spacers 31 are formed by deposition of a spacer dielectric material, followed by a spacer etch.

Figure 7A:
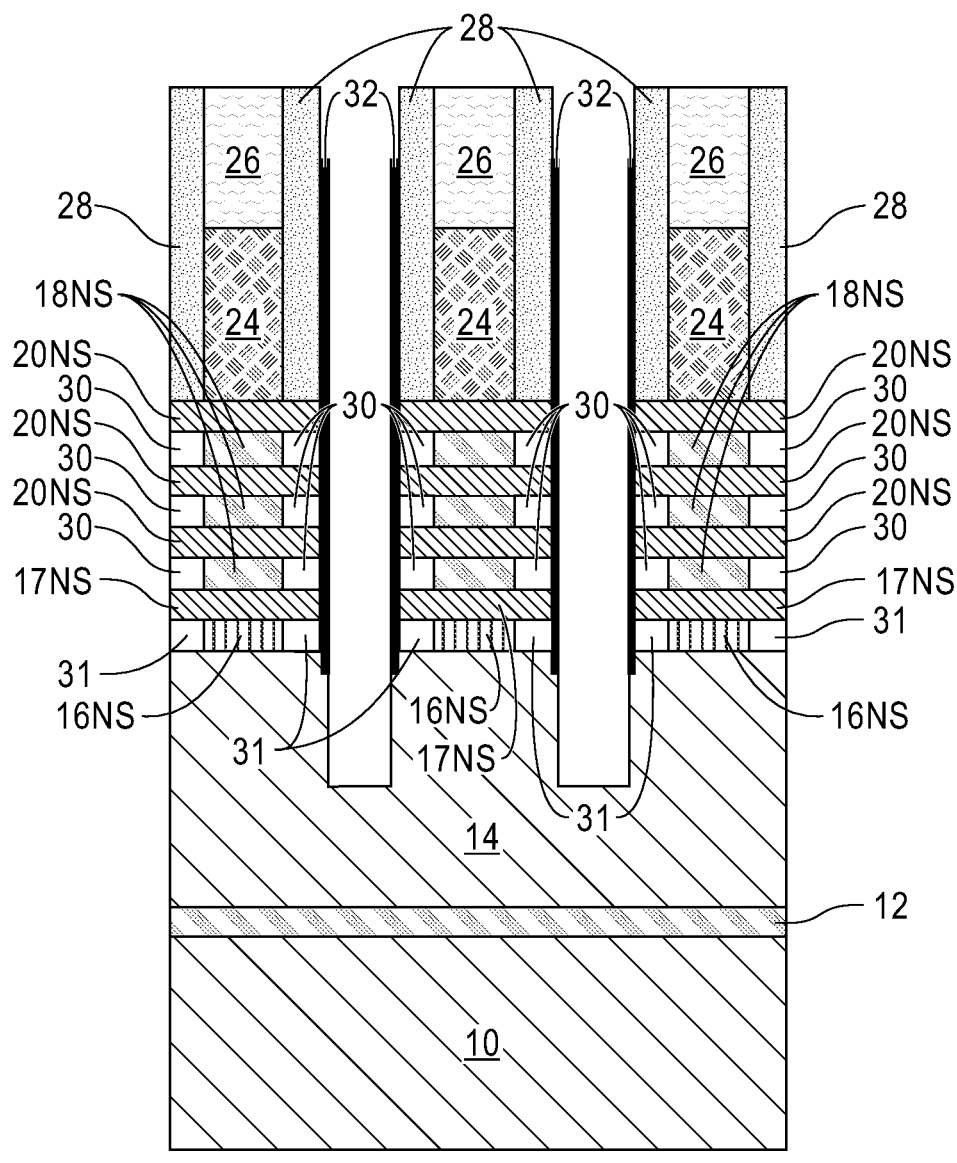
FIGS. 7A, 7B and 7C are cross sectional views of the exemplary semiconductor structure shown in FIGS. 6A, 6B and 6C, respectively, after forming a protective liner, and recessing of the second semiconductor layer to form a placeholder cavity.
Figure 7C:
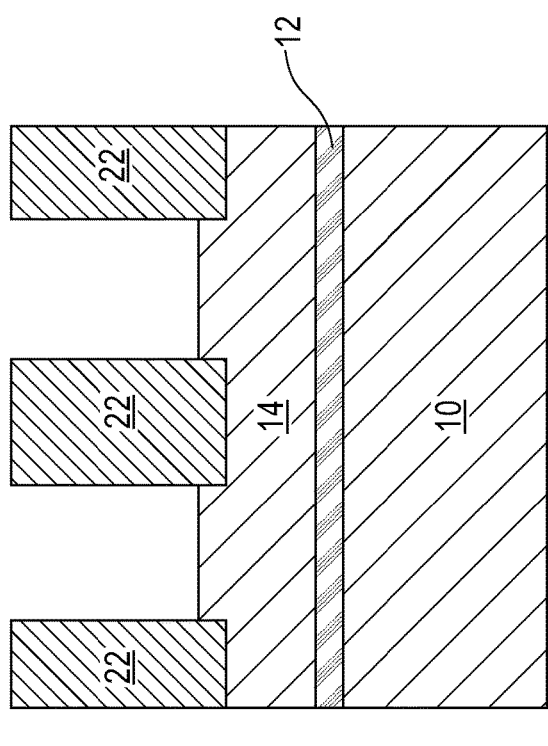
Figure 7B:
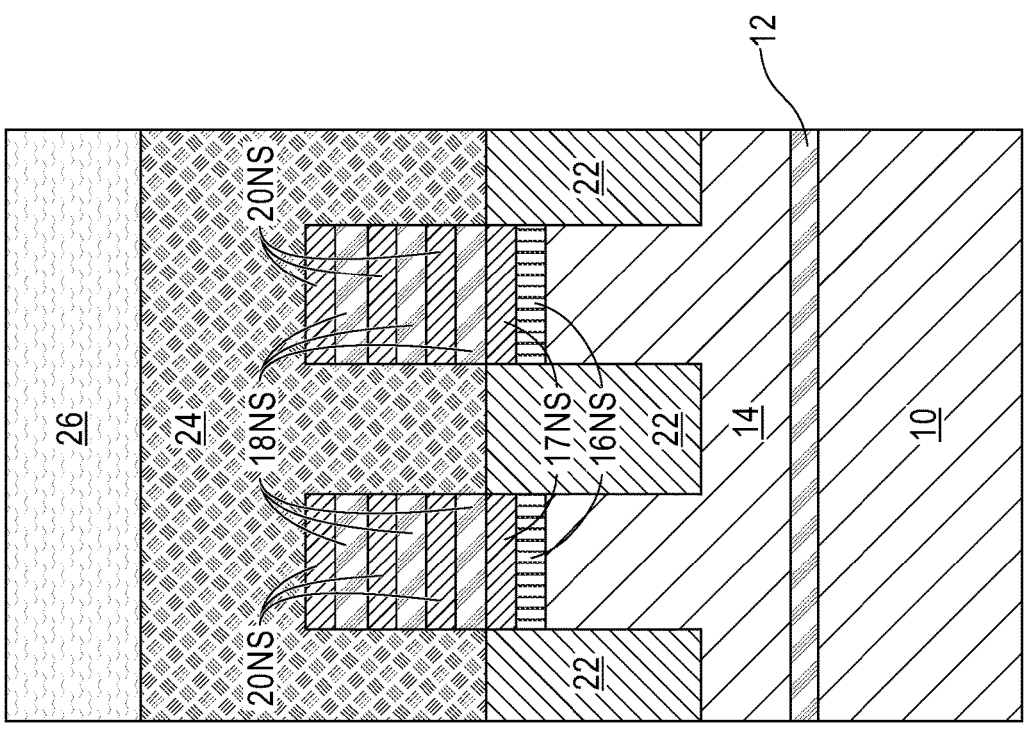

Referring now to FIGS. 7A, 7B and 7C, there are illustrated the exemplary semiconductor structure shown in FIGS. 6A, 6B and 6C, respectively, after forming a protective liner 32, and recessing of the second semiconductor layer 14 to form a placeholder cavity; a placeholder cavity is formed on each side of the patterned structure including, from bottom to top, the third semiconductor nanosheet 16NS, the fourth semiconductor nanosheet 17NS and the nanosheet stack of alternating sacrificial semiconductor material nanosheets 18NS and semiconductor channel material nanosheets 20NS. The protective liner 32 is formed along a sidewall of the gate spacer 28, a sidewall of each upper inner spacer 30 and a sidewall of the lower inner spacer 31, and a sidewall of the fourth semiconductor nanosheet 17NS. The protective liner 32 is composed of a dielectric material that is compositionally different from the hard mask cap 26, the gate spacers 28, the upper inner spacers 30 and the lower inner spacers 31. The dielectric material that provides the protective liner 32 can be composed of, for example, $AlO_x$ and $TiO_x$. The protective liner 32 can be formed by deposition (e.g., CVD, PECVD or atomic layer deposition (ALD)) of a layer of dielectric material, followed by a directional etching process that removes the as-deposited protective dielectric material from all horizontal surfaces of the structure. The recessing of the second semiconductor layer 14 includes a recess etch that is selective in removing the second semiconductor material that provides the second semiconductor layer 14. In one example, the recess etch includes RIE.

Figure 8A:
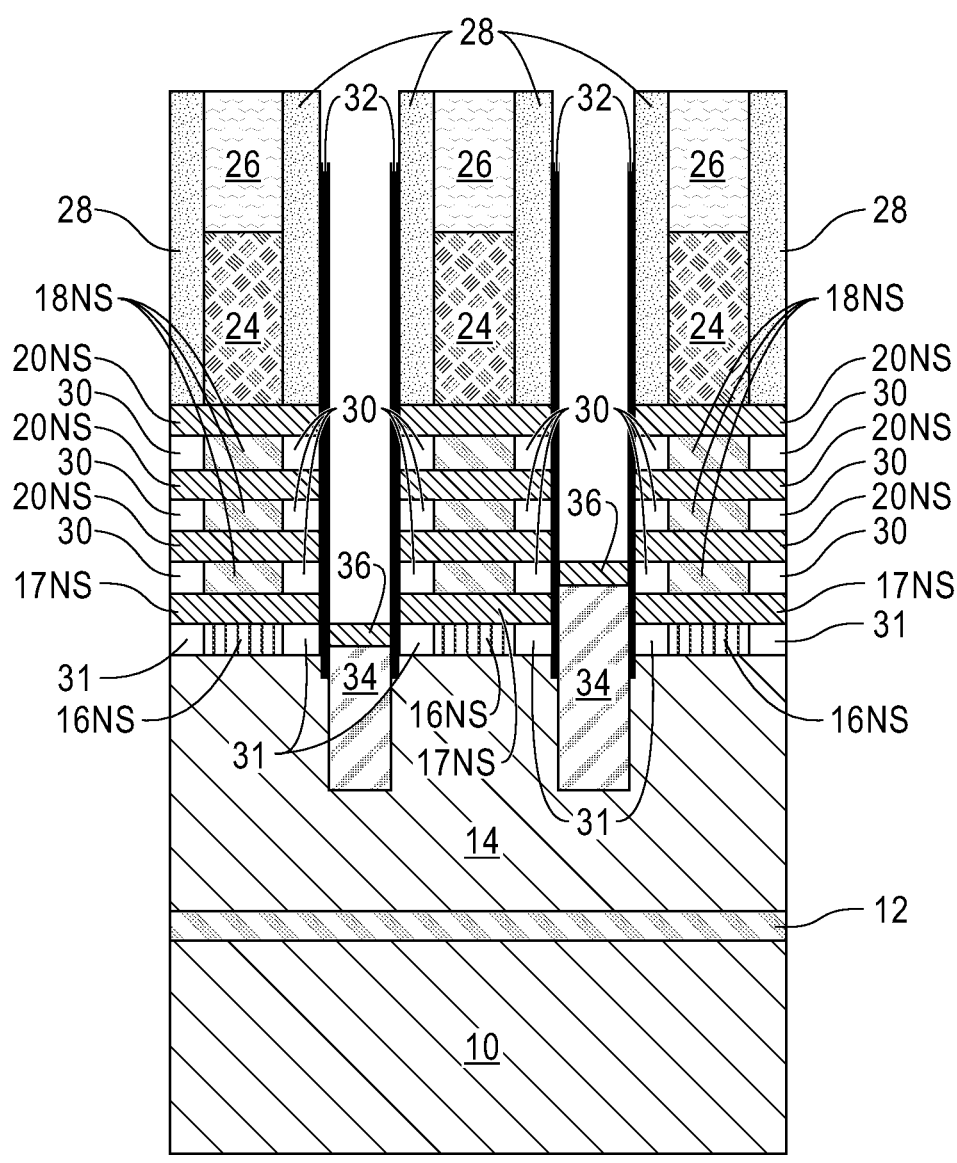
FIGS. 8A, 8B and 8C are cross sectional views of the exemplary semiconductor structure shown in FIGS. 7A, 7B and 7C, respectively, after forming a backside source/drain contact placeholder structure and a semiconductor buffer layer in the placeholder cavity.
Figure 8C:
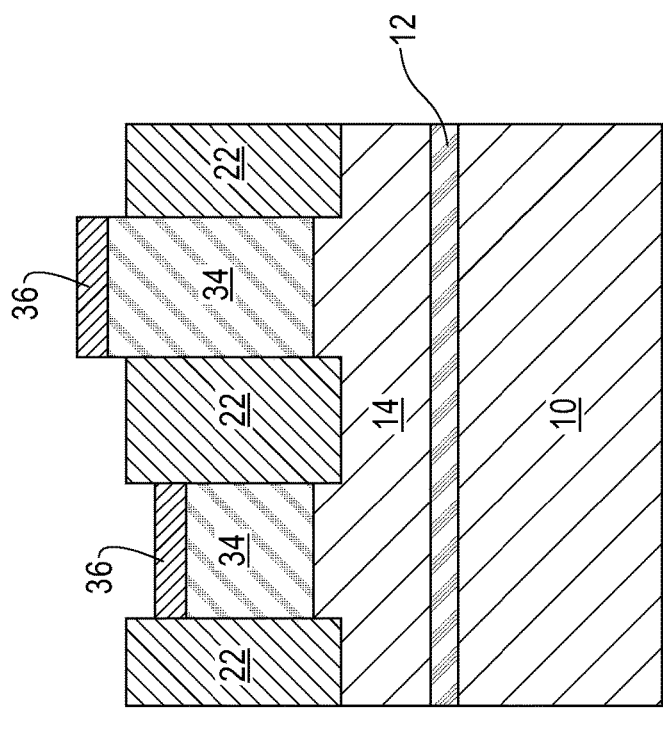
Figure 8B:
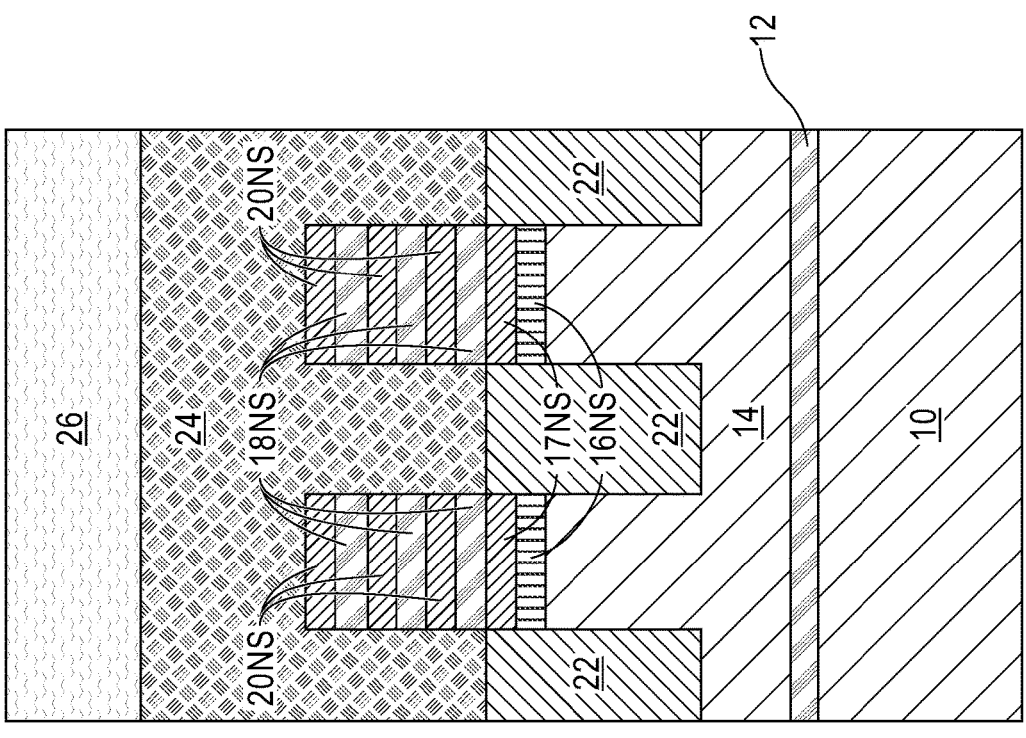

Referring now to FIGS. 8A, 8B and 8C, there are illustrated the exemplary semiconductor structure shown in FIGS. 7A, 7B and 7C, respectively, after forming a backside source/drain contact placeholder structure 34 and a semiconductor buffer layer 36 in each placeholder cavity. Due to processing variations, different height backside source/drain contact placeholder structures 34 as shown in FIGS. 8A and 8C typically form. In the present application, the backside source/drain contact placeholder structures 34 have a height in which the topmost surface of each backside source/drain contact placeholder structure 34 is anywhere between the topmost surface of the second semiconductor layer 14 to slightly above a topmost surface of the bottommost semiconductor channel material nanosheet 20NS. The backside source/drain contact placeholder structures 34 are composed of a seventh semiconductor material which is compositionally different from the second semiconductor material that provides the second semiconductor layer 12 and an eighth semiconductor material that provides the semiconductor buffer layer 36. In one example, the backside source/drain contact placeholder structures 34 are composed of a silicon germanium alloy, while the semiconductor buffer layer 36 is composed of silicon. The backside source/drain contact placeholder structures 34 can be formed by deposition (e.g., CVD, PECVD or epitaxial growth) of the seventh semiconductor material, followed by a recess etch. The semiconductor buffer layer 36 can be formed by deposition (e.g., CVD, PECVD or epitaxial growth) of the eighth semiconductor material, followed by a recess etch. Note that a lower portion of the protective liner 32 is present along sidewalls of the semiconductor buffer layer 36 and an upper portion of the sidewalls of the backside source/drain contact placeholder structures 34.

Figure 9A:
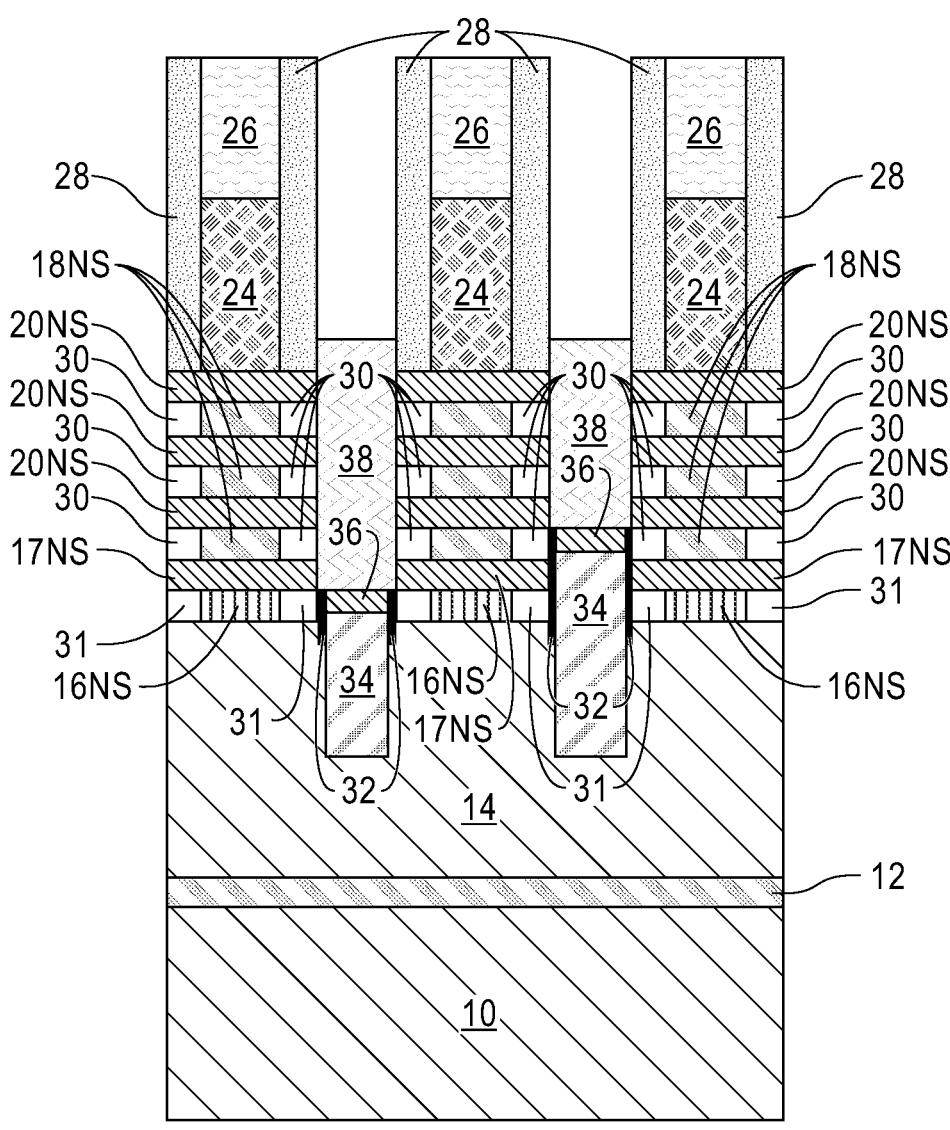
FIGS. 9A, 9B and 9C are cross sectional views of the exemplary semiconductor structure shown in FIGS. 8A, 8B and 8C, respectively, after removing an upper portion of the protective liner and forming source/drain regions on the semiconductor buffer layer.
Figure 9C:
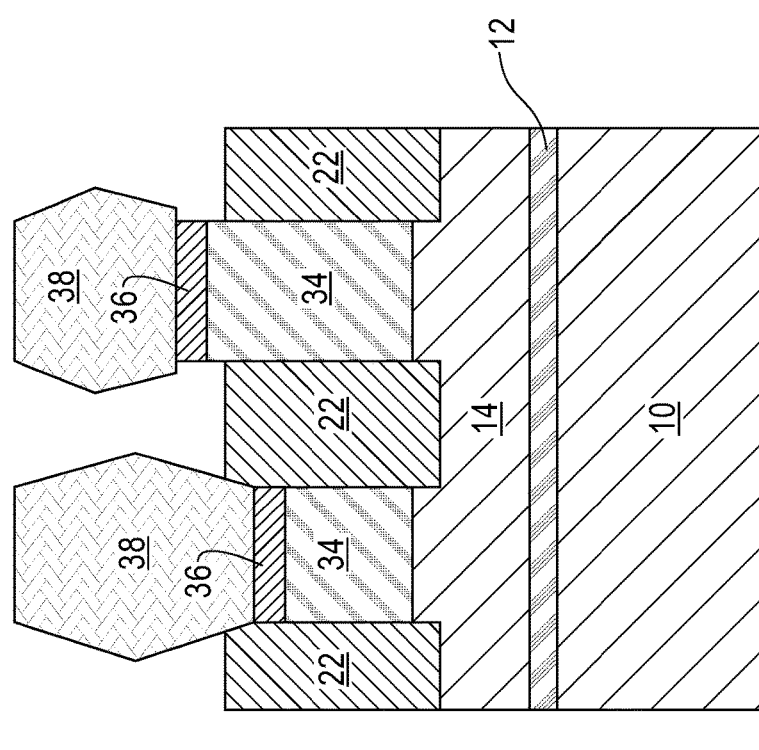
Figure 9B:
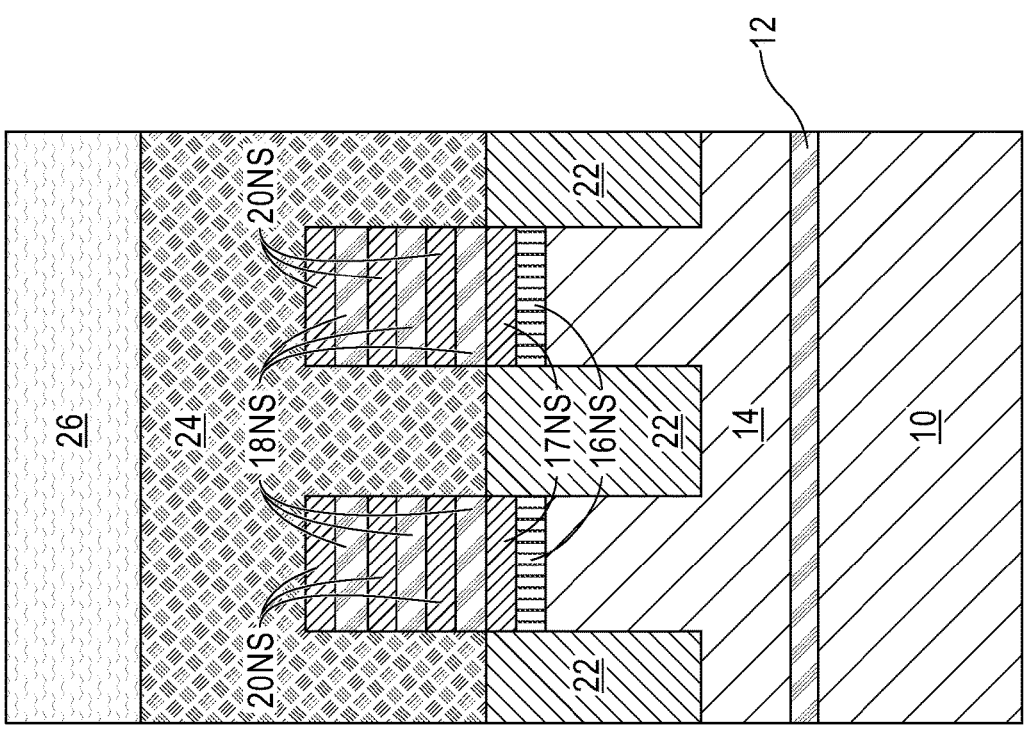

Referring now to FIGS. 9A, 9B and 9C, there are illustrated the exemplary semiconductor structure shown in FIGS. 8A, 8B and 8C, respectively, after removing an upper portion of the protective liner 32 and forming source/drain regions 38 on the semiconductor buffer layer 36. The upper portion of the protective liner 32 is removed utilizing an etch that is selective in removing the dielectric material that provides the protective liner 32. A lower portion of the protective liner 32 that is present along sidewalls of the semiconductor buffer layer 36 and an upper portion of the sidewalls of the backside source/drain contact placeholder structures 34 remain as is shown in FIG. 9A. In the present application, each nanosheet transistor that is formed will include a pair of source/drain regions 38. Due to the process variations, one of the source/drain regions (i.e., a first source/drain region) of the pair of source/drain regions can have a vertical height that differs from a vertical height of the other source/drain region (i.e., a second source/drain region of the pair of source/drain regions 38, See, for example, FIGS. 9A and 9C.

The source/drain regions 38 are typically formed by an epitaxial growth process, as defined above. A recess etch can follow the epitaxial growth process. The source/drain regions 38 extend outward from a sidewall of each semiconductor channel material nanosheet 20NS and upward from the semiconductor buffer layer 36. Each of the source/drain regions 38 is composed of a ninth semiconductor material and a dopant. As used herein, a "source/drain" region can be a source region or a drain region depending on subsequent wiring and application of voltages during operation of the transistor. The ninth semiconductor material that provides the source/drain regions 38 can be compositionally the same, or compositionally different from, the sixth semiconductor material that provides each semiconductor channel material nanosheet 20NS. The dopant that is present in the source/drain regions 38 can be either a p-type dopant or an n-type dopant. The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium, phosphorus and indium. "N-type" refers to the addition of impurities that contributes free electrons to an intrinsic semiconductor. In a silicon containing semiconductor material, examples of n-type dopants, i.e., impurities, include, but are not limited to, antimony, arsenic and phosphorous. In one example, each source/drain region 38 can have a dopant concentration of from $4 \times 10^{20}$ atoms/cm$^3$ to $3 \times 10^{21}$ atoms/cm$^3$.

Figure 10A:
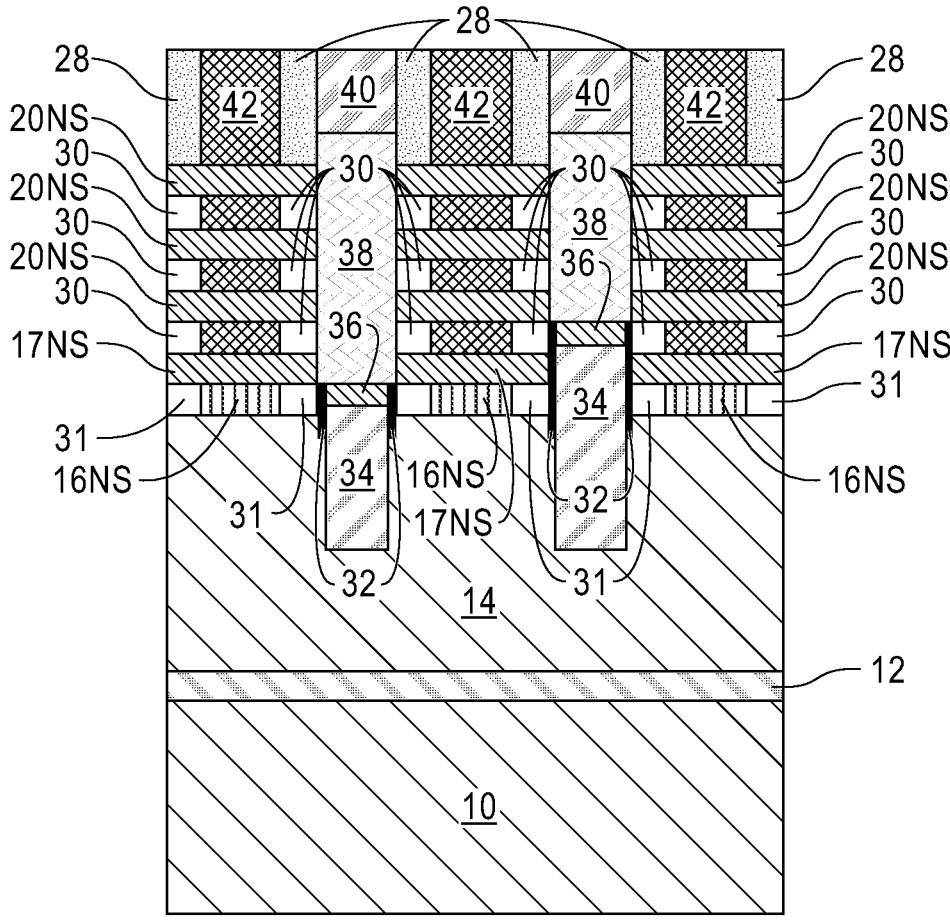
FIGS. 10A, 10B and 10C are cross sectional views of the exemplary semiconductor structure shown in FIGS. 9A, 9B and 9C, respectively, after forming a first frontside interlayer dielectric (ILD) layer on top of each source/drain region, removing the sacrificial gate structure to reveal an underlying nanosheet stack, removing each sacrificial semiconductor material nanosheet of the revealed nanosheet stacks, and forming a gate structure wrapped around a suspended portion of each semiconductor channel material nanosheet.
Figure 10C:
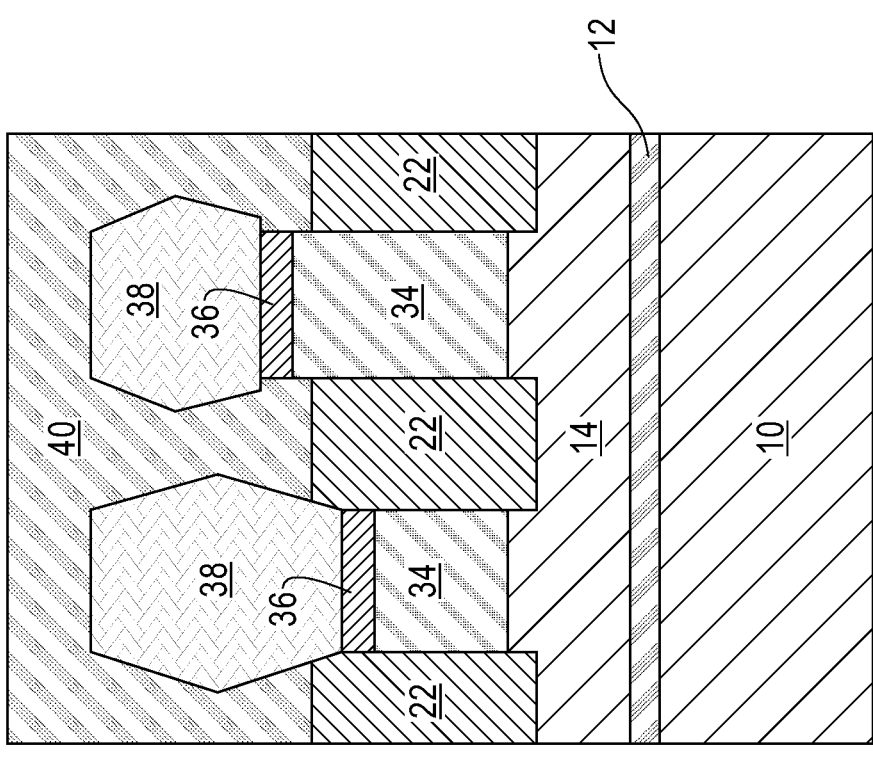
Figure 10B:
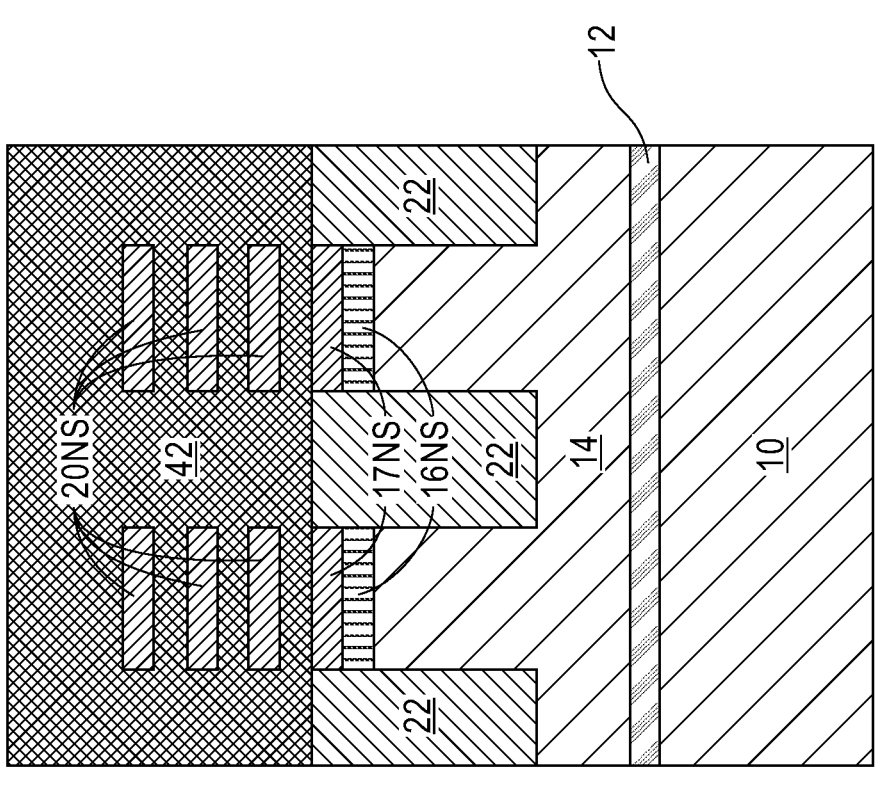

Referring now to FIGS. 10A, 10B and 10C, there are illustrated the exemplary semiconductor structure shown in FIGS. 9A, 9B and 9C, respectively, after forming a first frontside ILD layer 40 on top of each source/drain region 38, removing the sacrificial gate structure 24 to reveal the underlying nanosheet stack, removing each sacrificial semiconductor material nanosheet 18NS of revealed nanosheet stack, and forming a gate structure wrapped around a suspended portion of each semiconductor channel material nanosheet 20NS.

The first frontside ILD layer 40 is composed of a dielectric material including, for example, silicon oxide, silicon nitride, undoped silicate glass (USG), fluorosilicate glass (FSG), borophosphosilicate glass (BPSG), a spin-on low-k dielectric layer, a chemical vapor deposition (CVD) low-k dielectric layer, or any combination thereof. The term "low-k" as used throughout the present application denotes a dielectric material that has a dielectric constant of less than 4.0 (all dielectric constants mentioned herein are relative to a vacuum unless otherwise noted). The first frontside ILD layer 40 can be formed by a deposition process including, but not limited to, CVD, PECVD or spin-on coating. A planarization process such as, for example, chemical mechanical polishing (CMP) follows the deposition process. The planarization process can remove an upper portion of the gate spacer 28, and if present, the hard mask cap 26. This planarization process reveals the sacrificial gate structure 24.

The sacrificial gate structure 24 can be removed from the structure utilizing a material removal process such as, for example, etching, that is selective in removing the sacrificial gate structure 24. This material removal steps revels the underlying nanosheet stack. After revealing the nanosheet stack, each sacrificial semiconductor material nanosheet 18NS is removed to suspend a portion of each semiconductor channel material nanosheet 20NS. Each sacrificial semiconductor material nanosheet 18NS is removed utilizing any material removal process such as, for example, etching, which is selective in removing the sacrificial semiconductor material nanosheets 18NS.

The gate structure 42 is formed in the area previously accompanied by the sacrificial semiconductor material nanosheets 18NS and atop the topmost semiconductor channel material nanosheet 20NS. The gate structure 42 wraps around each of the semiconductor material nanosheets 20NS within each nanosheet stack. The gate structure 42 includes a gate dielectric layer and a gate electrode; both the gate dielectric layer and the gate electrode are not separately shown in the drawing, but both are included in the area shown as the gate structure 42. As is known, the gate dielectric layer is formed directly around the suspended portion of each semiconductor channel material nanosheet 20NS and the gate electrode is formed on the gate dielectric layer. The gate dielectric layer of the gate structure 42 is composed of a gate dielectric material that has a dielectric constant of greater than 4.0. Illustrative examples of gate dielectric materials that can be used in providing the gate dielectric layer include, but are not limited to, hafnium dioxide ($HfO_2$), hafnium silicon oxide (HfSiO), hafnium silicon oxynitride (HfSiO), lanthanum oxide ($La_2O_3$), lanthanum aluminum oxide ($LaAlO_3$), zirconium dioxide ($ZrO_2$), zirconium silicon oxide ($ZrSiO_4$), zirconium silicon oxynitride ($ZrSiO_xN_y$), tantalum oxide ($TaO_x$), titanium oxide (TiO), barium strontium titanium oxide ($BaO_6SrTi_2$), barium titanium oxide ($BaTiO_3$), strontium titanium oxide ($SrTiO_3$), yttrium oxide ($Yb_2O_3$), aluminum oxide ($Al_2O_3$), lead scandium tantalum oxide ($Pb(Sc,Ta)O_3$), and/or lead zinc niobite ($Pb(Zn,Nb)O$). The gate dielectric material can further include dopants such as lanthanum (La), aluminum (Al) and/or magnesium (Mg).

The gate electrode of the gate structure 42 is composed of a gate electrode material. The gate electrode material can include a work function metal (WFM) and optionally a conductive metal. The WFM can be used to set a threshold voltage of the transistor to a desired value. In some embodiments, the WFM can be selected to effectuate an n-type threshold voltage shift. "N-type threshold voltage shift" as used herein means a shift in the effective work-function of the work-function metal-containing material towards a conduction band of silicon in a silicon-containing material. In one embodiment, the work function of the n-type work function metal ranges from 4.1 eV to 4.3 eV. Examples of such materials that can effectuate an n-type threshold voltage shift include, but are not limited to, titanium aluminum, titanium aluminum carbide, tantalum nitride, titanium nitride, hafnium nitride, hafnium silicon, or combinations and thereof. In other embodiments, the WFM can be selected to effectuate a p-type threshold voltage shift. In one embodiment, the work function of the p-type work function metal ranges from 4.9 eV to 5.2 eV. As used herein, "threshold voltage" is the lowest attainable gate voltage that will turn on a semiconductor device, e.g., transistor, by making the channel of the device conductive. The term "p-type threshold voltage shift" as used herein means a shift in the effective work-function of the work-function metal-containing material towards a valence band of silicon in the silicon containing material. Examples of such materials that can effectuate a p-type threshold voltage shift include, but are not limited to, titanium nitride, and tantalum carbide, hafnium carbide, and combinations thereof. The optional conductive metal can include, but is not limited to aluminum (Al), tungsten (W), or cobalt (Co). The gate structure 42 can be formed by deposition of the gate dielectric material and the gate electrode material, followed by a planarization process which removes any gate dielectric material and gate electrode material that is formed atop the gate spacers 28.

Figure 11A:
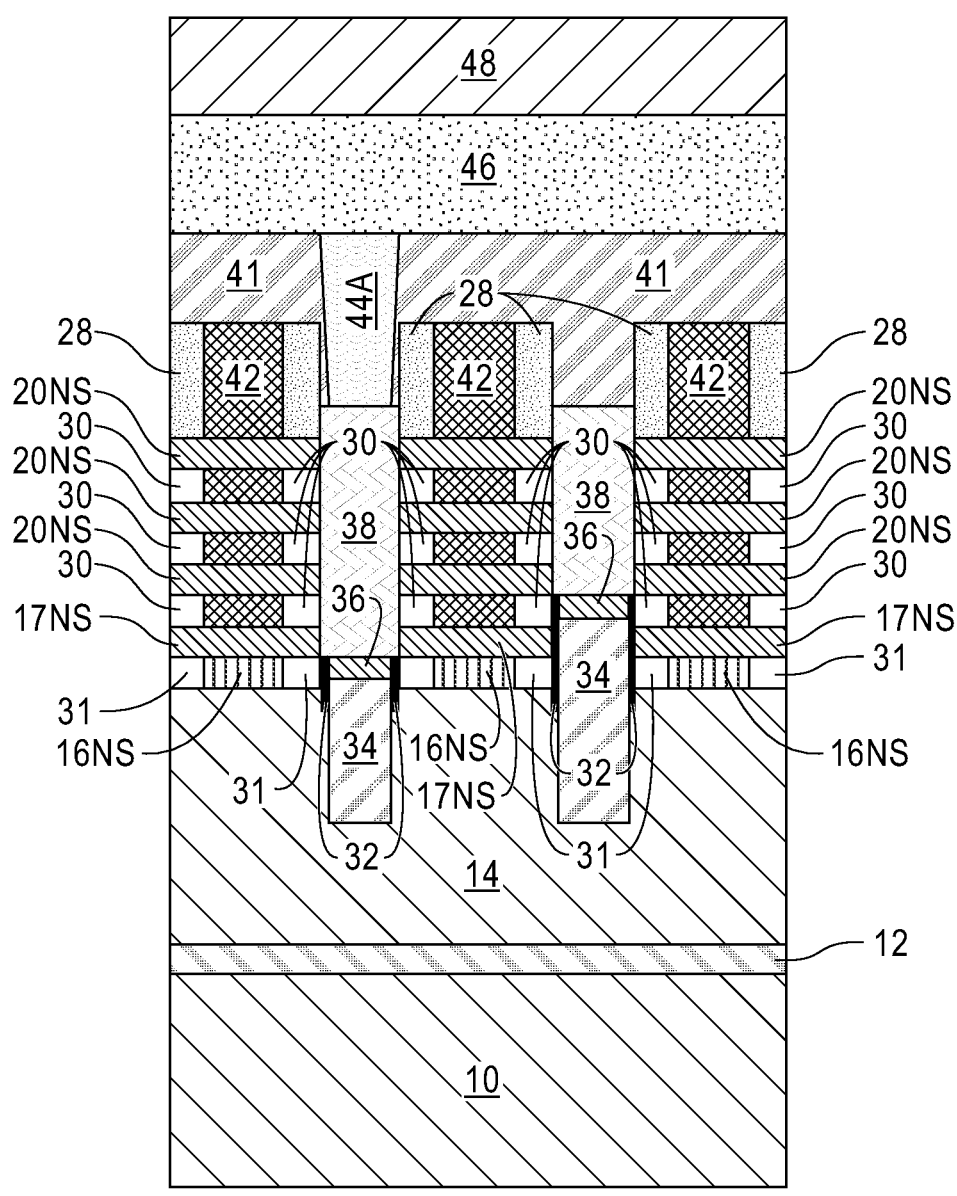
FIGS. 11A, 11B and 11C are cross sectional views of the exemplary semiconductor structure shown in FIGS. 10A, 10B and 10C, respectively, after forming a second frontside ILD layer, wherein the first frontside ILD layer and the second frontside ILD layer collectively form a middle-ofthe-line (MOL) dielectric multilayered structure, forming frontside contact structures in the MOL dielectric multilayered structure, forming a frontside back-end-of-the-line (BEOL) structure and a carrier wafer.
Figure 11C:
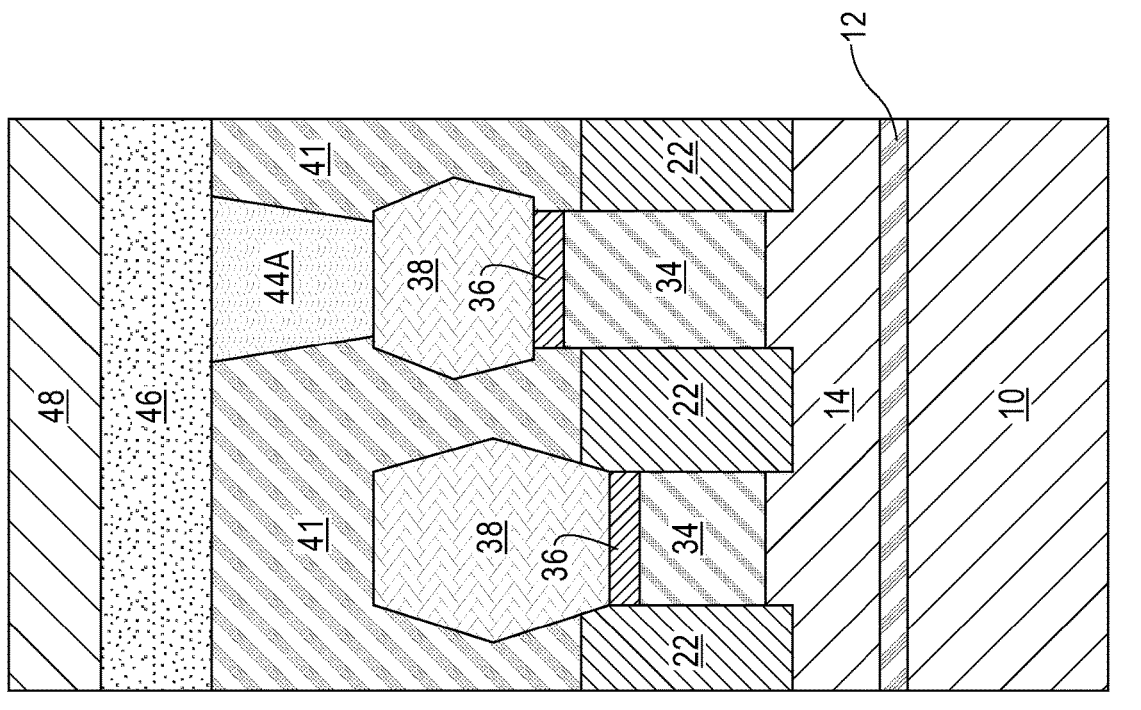
Figure 11B:
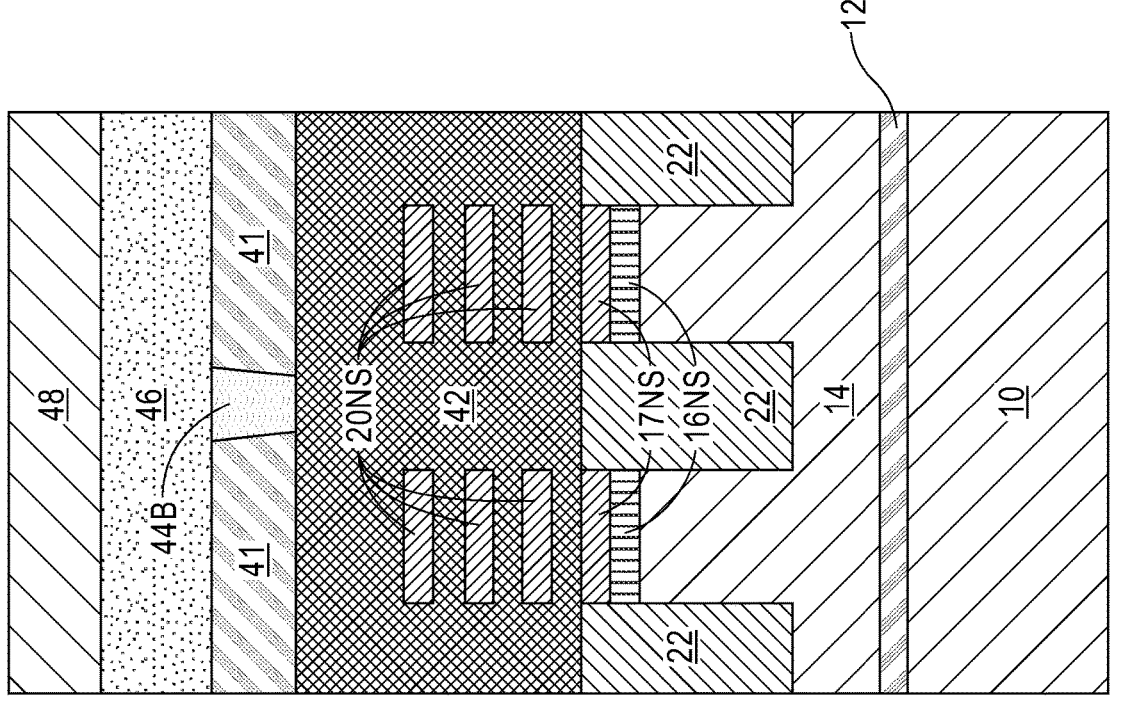

Referring now to FIGS. 11A, 11B and 11C, there are illustrated the exemplary semiconductor structure shown in FIGS. 10A, 10B and 10C, respectively, after forming a second frontside ILD layer, wherein the first frontside ILD layer 40 and the second frontside ILD layer collectively form a middle-of-the-line (MOL) dielectric multilayered structure 41, forming frontside contact structures in the MOL dielectric multilayered structure 41, forming a frontside BEOL structure 46 and a carrier wafer 48.

The second frontside ILD layer includes one of the dielectric materials mentioned above for the first frontside ILD layer 40. The dielectric material that provides the second frontside ILD layer can be compositionally the same as, or compositionally different from, the dielectric material that provides the first frontside ILD layer 40. The second frontside ILD layer is formed on top of each of the gate structure 42, the gate spacer 28, and the first frontside ILD layer 40. The second frontside ILD layer can be formed utilizing one of the deposition processes mentioned above in forming the first frontside ILD layer 40. As mentioned above, the first frontside ILD layer 40 and the second frontside ILD layer collectively provide MOL dielectric multilayered structure 41 as shown in FIGS. 11A-11C.

The frontside contact structures are now formed into the MOL dielectric multilayered structure 41. The frontside contact structures include frontside source/drain contact structures 44A and a frontside gate contact structure 44B. The frontside contact structures are formed utilizing a metallization process. The metallization process includes forming contact openings in the MOL dielectric multilayered structure 41 and the filling (including deposition and planarization) those contact openings with at least a contact conductor material. The contact conductor material that can be used for providing the frontside contact structures includes, for example, a silicide liner, such as Ni, Pt, NiPt, an adhesion metal liner, such as TiN, and conductive metals such as W, Cu, Al, Co, Ru, Mo, Os, Ir, Rh, or an alloy thereof. The frontside contact structures can also include one or more contact liners (not shown). In one or more embodiments, the contact liner (not shown) can include a diffusion barrier material. Exemplary diffusion barrier materials include, but are not limited to, Ti, Ta, Ni, Co, Pt, W, Ru, TiN, TaN, WN, WC, an alloy thereof, or a stack thereof such as Ti/TiN and Ti/WC. In one or more embodiments in which a contact liner is present, the contact liner (not shown) can include a silicide liner, such as Ti, Ni, NiPt, etc., and a diffusion barrier material, as defined above.

Next, frontside BEOL structure 46 is formed on the uppermost surface of the MOL dielectric multilayered structure 41. The frontside BEOL structure 46 can include one or more interconnect dielectric material layers (including one of the dielectric materials mentioned above for the first frontside ILD layer 40) that contain frontside metal wires (the metal wires can be composed of any electrically conductive metal or electrically conductive metal alloy) embedded therein. Electrical contact of the frontside BEOL structure 46 to each frontside contact structure is made.

The carrier wafer 48 can include one of the semiconductor materials mentioned above for the first semiconductor layer 10. Carrier wafer 48 is bonded to the frontside BEOL structure 46 after frontside BEOL structure 46 formation.

Figure 12A:
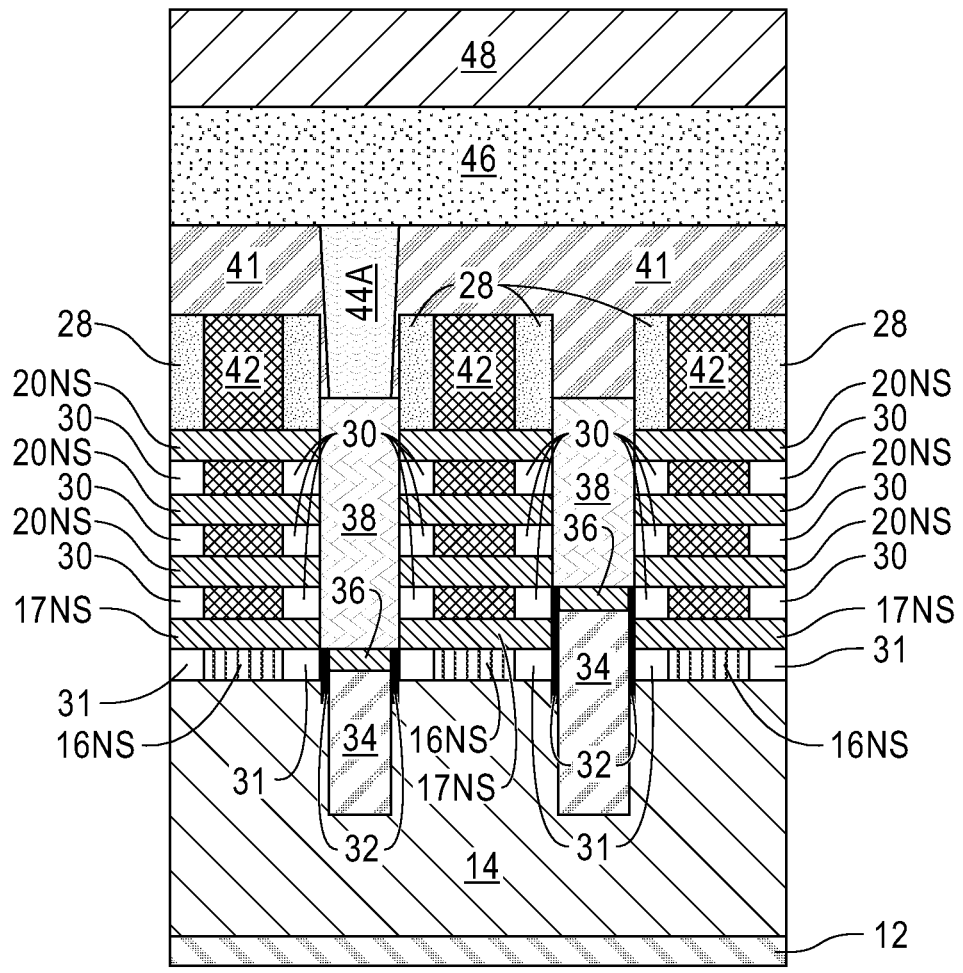
FIGS. 12A, 12B and 12C are cross sectional views of the exemplary semiconductor structure shown in FIGS. 11A, 11B and 11C, respectively, after removing the first semiconductor layer to reveal the etch stop layer.
Figure 12C:
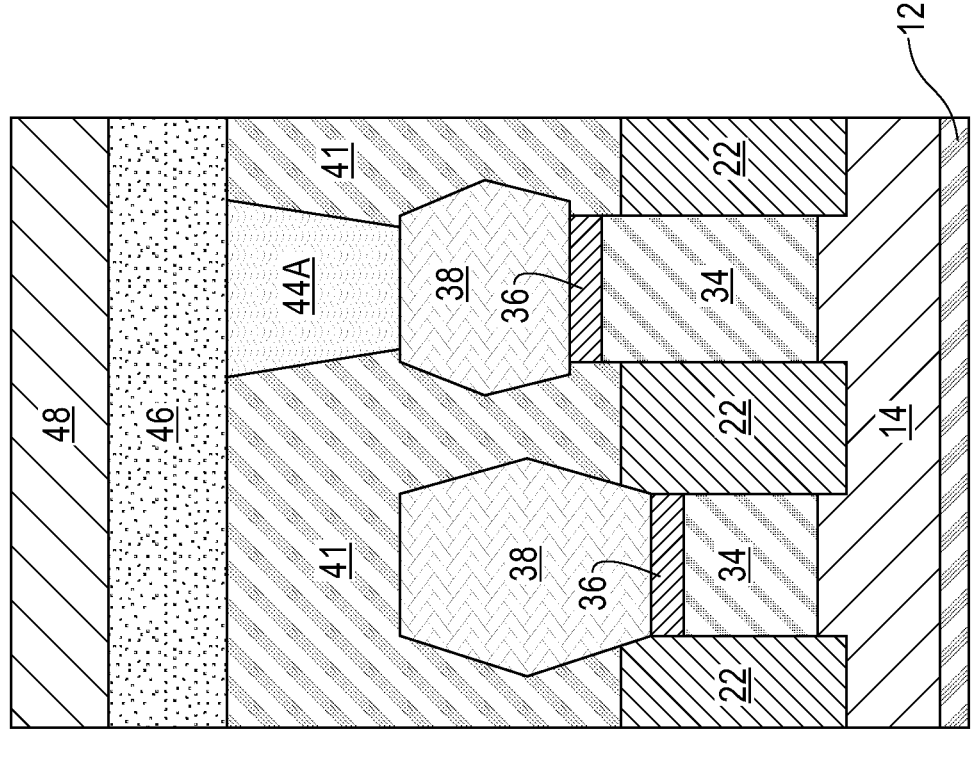
Figure 12B:
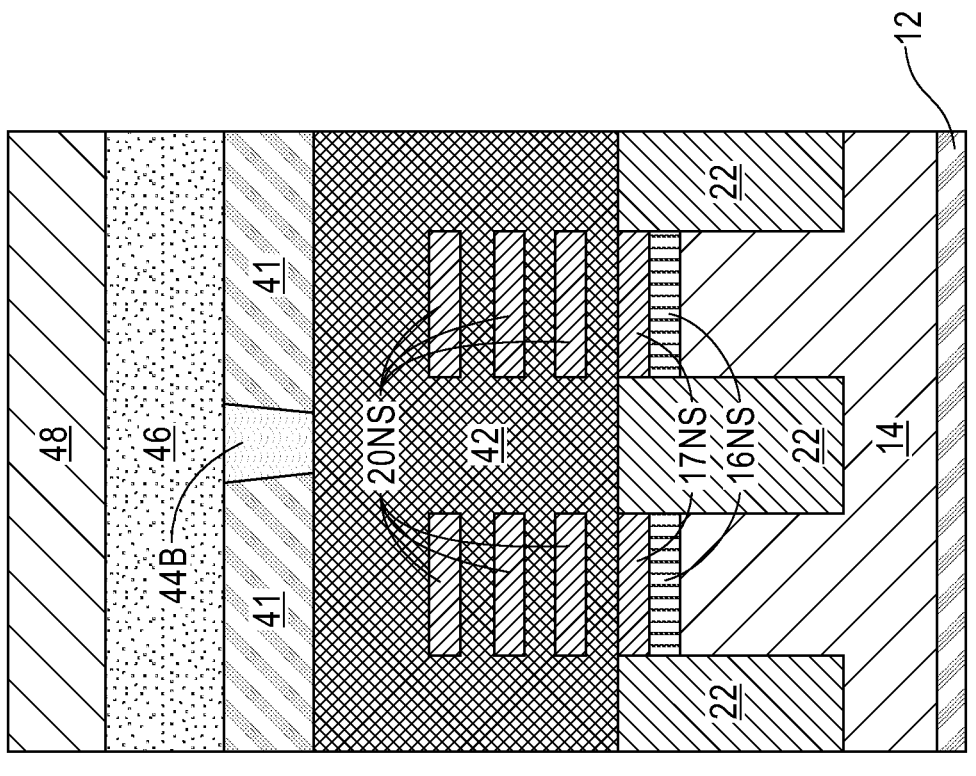

Referring now to FIGS. 12A, 12B and 12C, there are illustrated the exemplary semiconductor structure shown in FIGS. 11A, 11B and 11C, respectively, after removing the first semiconductor layer 10 to reveal the etch stop layer 12. The removal of the first semiconductor layer 10 typically includes flipping the wafer 1800 to physically expose a backside of the substrate. This flipping step is not shown in the drawings of the present application for clarity. The flipping physically exposes the first semiconductor layer 10 and will allow backside processing of the exemplary structure. Flipping of the structure can be performed by hand or by utilizing a mechanical means such as, for example, a robot arm. In the illustrated embodiment, the removal of the physically exposed first semiconductor layer 10 physically exposes the etch stop layer 12. The removal of the first semiconductor layer 10 can be performed utilizing a material removal process that is selective in removing the first semiconductor material that provides the first semiconductor layer 10.

Figure 13A:
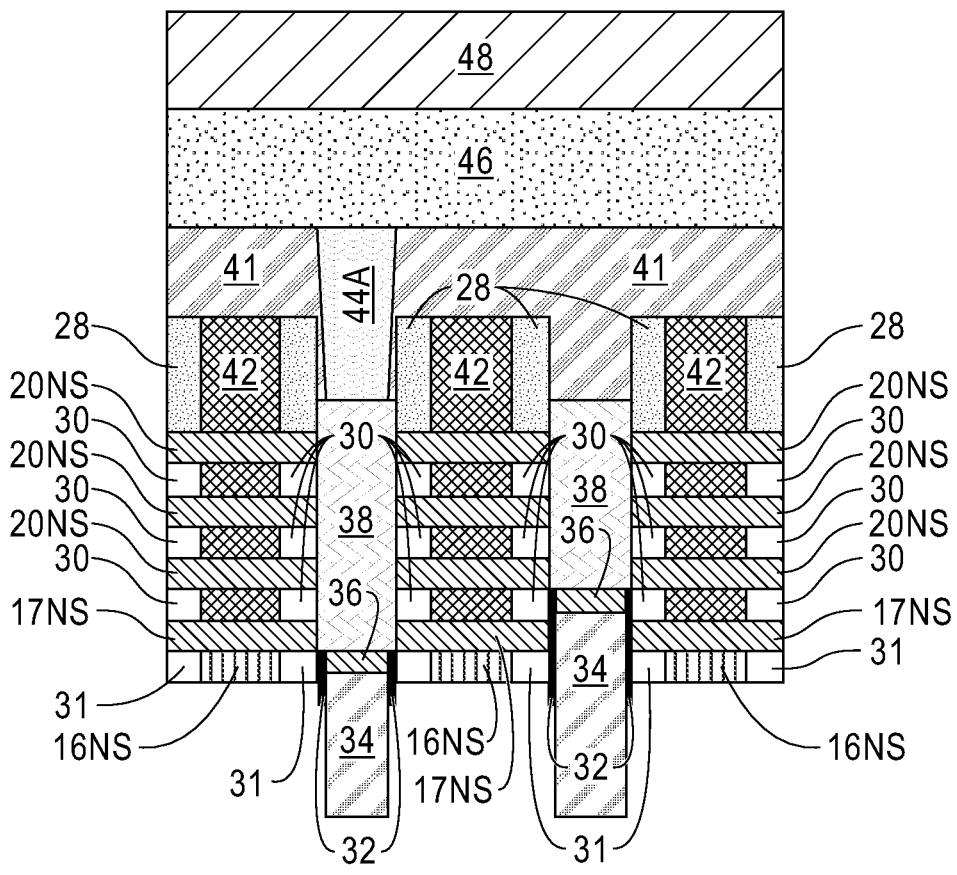
FIGS. 13A, 13B and 13C are cross sectional views of the exemplary semiconductor structure shown in FIGS. 12A, 12B and 12C, respectively, after removing the etch stop layer and the second semiconductor layer.
Figure 13C:
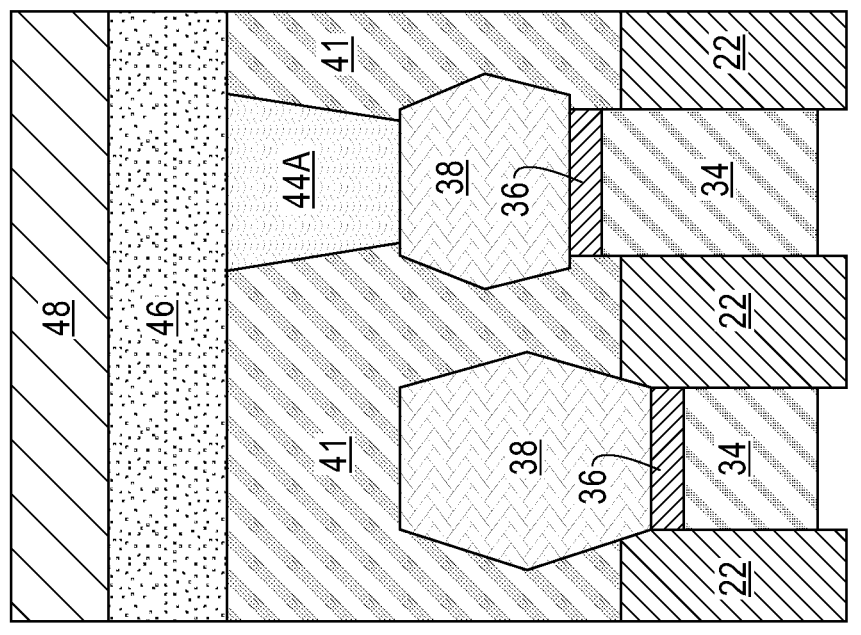
Figure 13B:
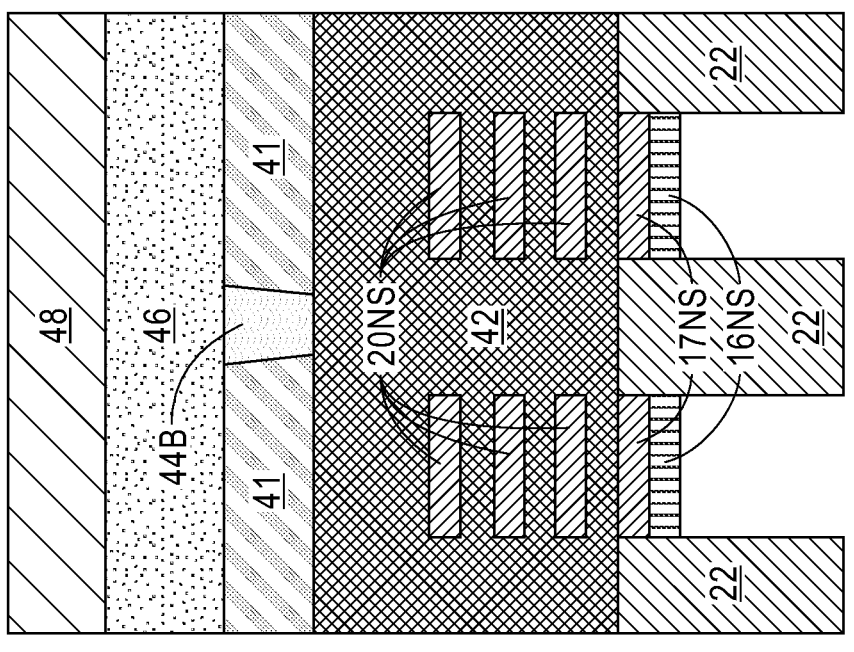

Referring now to FIGS. 13A, 13B and 13C, there are illustrated the exemplary semiconductor structure shown in FIGS. 12A, 12B and 12C, respectively, after removing the etch stop layer 12 and the second semiconductor layer 14. The removal of the etch stop layer 12 includes a material removal process that is selective in removing the etch stop layer 12. The removal of the etch stop layer 12 physically exposes the second semiconductor layer 14. The physically exposed second semiconductor layer 14 can be removed utilizing a material removal process that is selective in removing that layer from the structure. As is illustrated in FIGS. 13A-13C, the removal the etch stop layer 12 and the second semiconductor layer 14 reveals a surface of each of the third semiconductor nanosheets 16NS, the lower inner spacers 31, the remaining protective liner 32 and the backside source/drain contact placeholder structure 34. Note that the removal of the second semiconductor layer 14 also reveals surfaces of the shallow trench isolation structure 22 as is illustrated in FIGS. 13B and 13C.

Figure 14A:
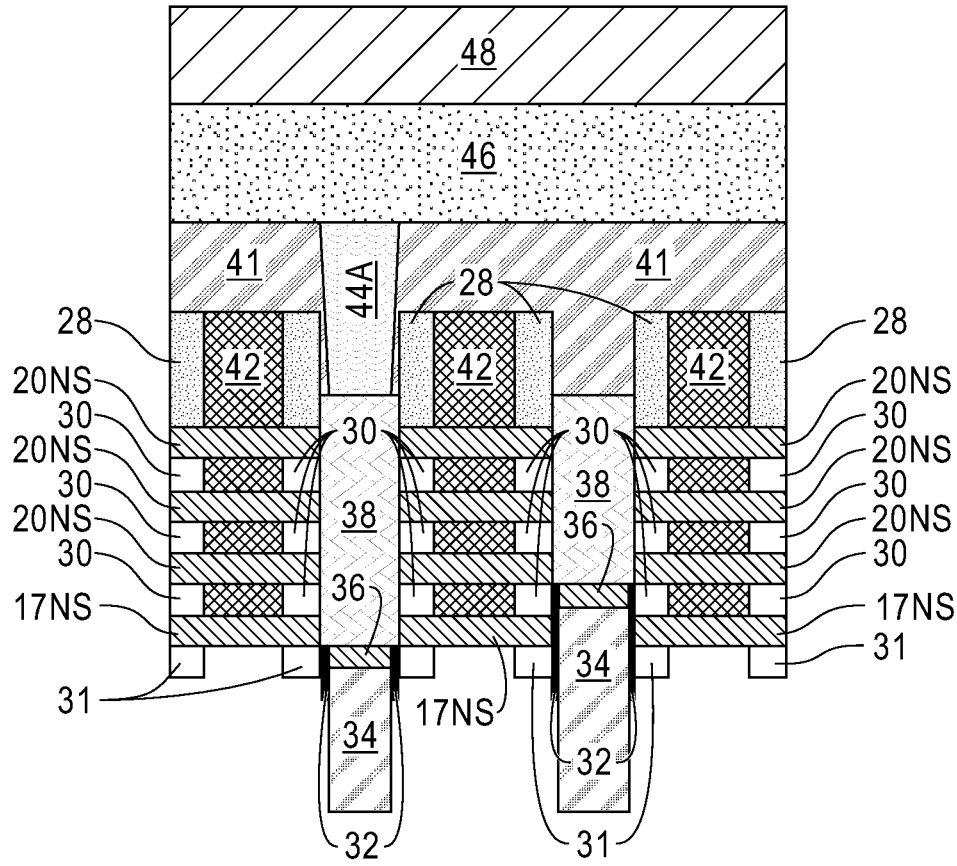
FIGS. 14A, 14B and 14C are cross sectional views of the exemplary semiconductor structure shown in FIGS. 13A, 13B and 13C, respectively, after removing the twice patterned third semiconductor layer.
Figure 14C:
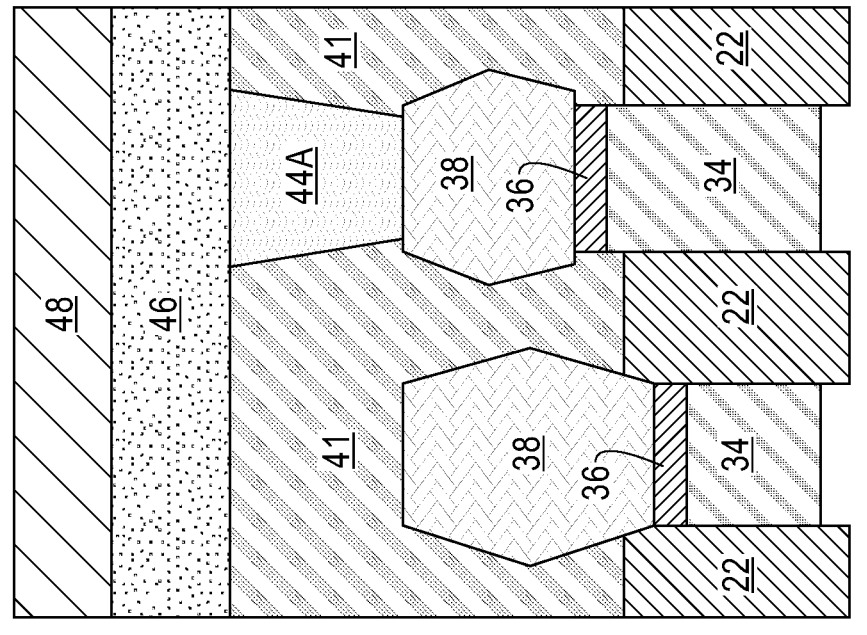
Figure 14B:
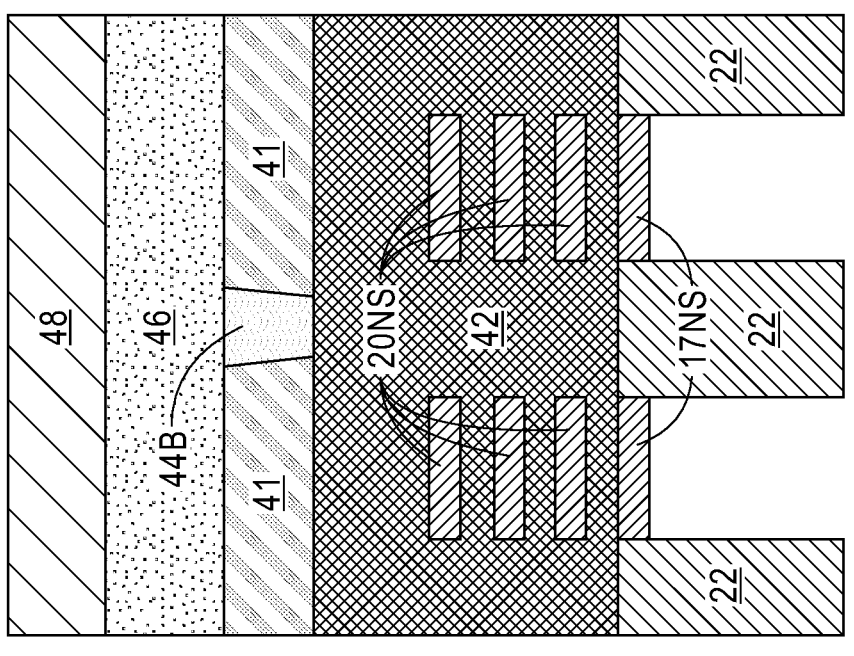

Referring now to FIGS. 14A, 14B and 14C, there are illustrated the exemplary semiconductor structure shown in FIGS. 13A, 13B and 13C, respectively, after removing the twice patterned third semiconductor layer (i.e., the third semiconductor nanosheets 16NS). This removal steps reveals the fourth semiconductor nanosheets 17NS. The removal of the third semiconductor nanosheets 16NS includes a material removal process such as, for example, an etch, that is selective in removing each third semiconductor nanosheet 16NS.

Figure 15A:
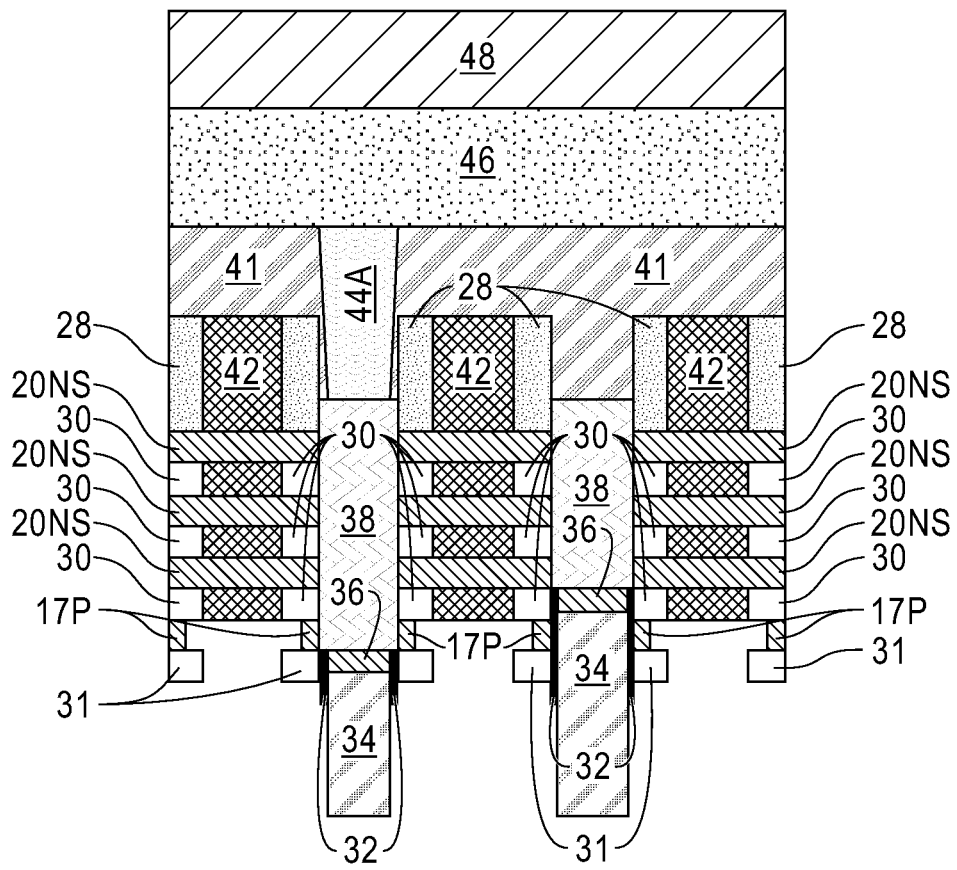
FIGS. 15A, 15B and 15C are cross sectional views of the exemplary semiconductor structure shown in FIGS. 14A, 14B and 14C, respectively, after under etching the twice patterned fourth semiconductor layer, wherein the under etch leaves a semiconductor pedestal between a lower inner spacer and an upper inner spacer that is located directly above the lower inner spacer.
Figure 15C:
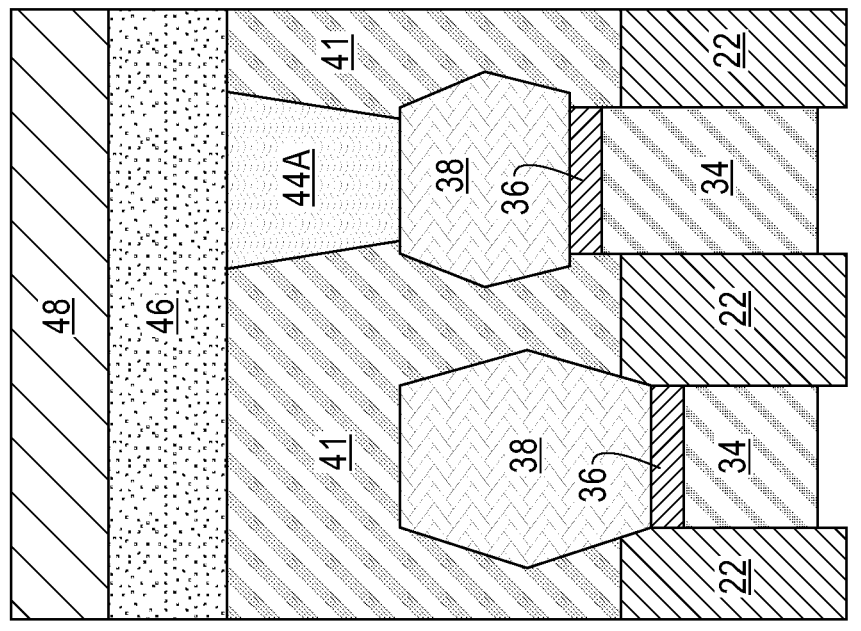
Figure 15B:
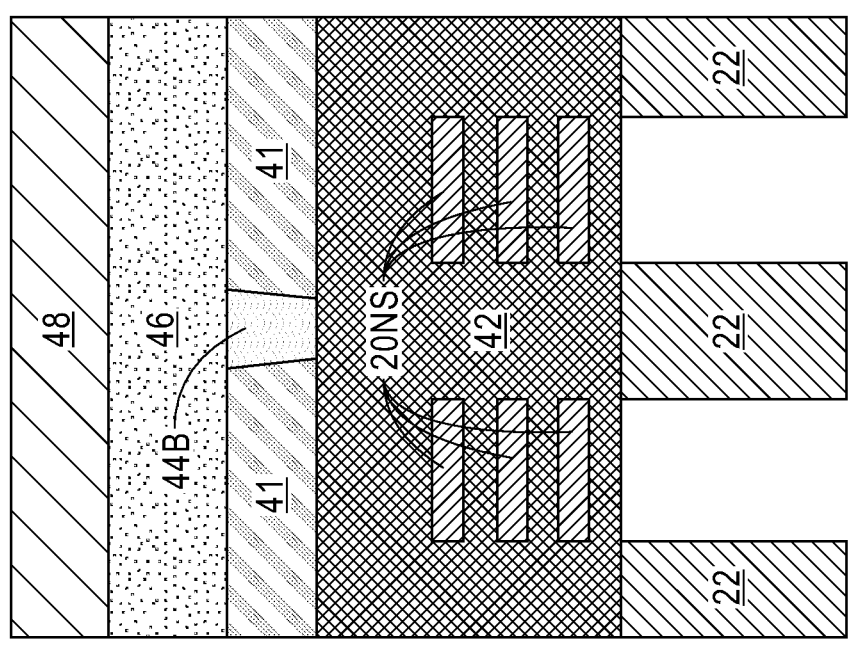

Referring now to FIGS. 15A, 15B and 15C, there are illustrated the exemplary semiconductor structure shown in FIGS. 14A, 14B and 14C, respectively, after under etching the twice patterned fourth semiconductor layer (i.e., the fourth semiconductor nanosheet 17NS), wherein the under etch leaves a semiconductor pedestal 17P between lower inner spacer 31 and an upper inner spacer 30 that is located directly above the lower inner spacer 31. It is noted that if an over etch is performed, it could damage the source/drain regions 38. As is illustrated, the semiconductor pedestal 17P has a width that is less than a width of the upper inner spacers 30 and a width of the lower inner spacers 31. The semiconductor pedestals 17P are composed of the fourth semiconductor material mentioned above.

Figure 16A:
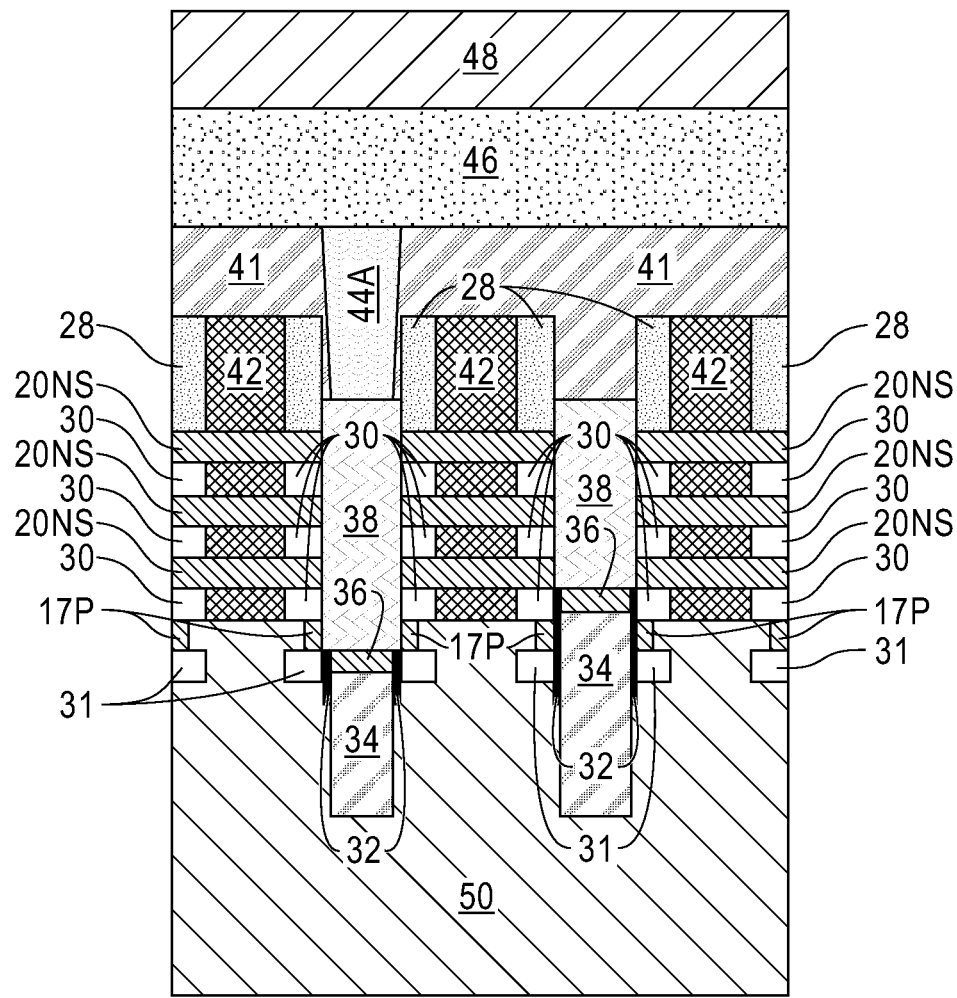
FIGS. 16A, 16B and 16C are cross sectional views of the exemplary semiconductor structure shown in FIGS. 15A, 15B and 15C, respectively, after forming a backside ILD layer.
Figure 16C:
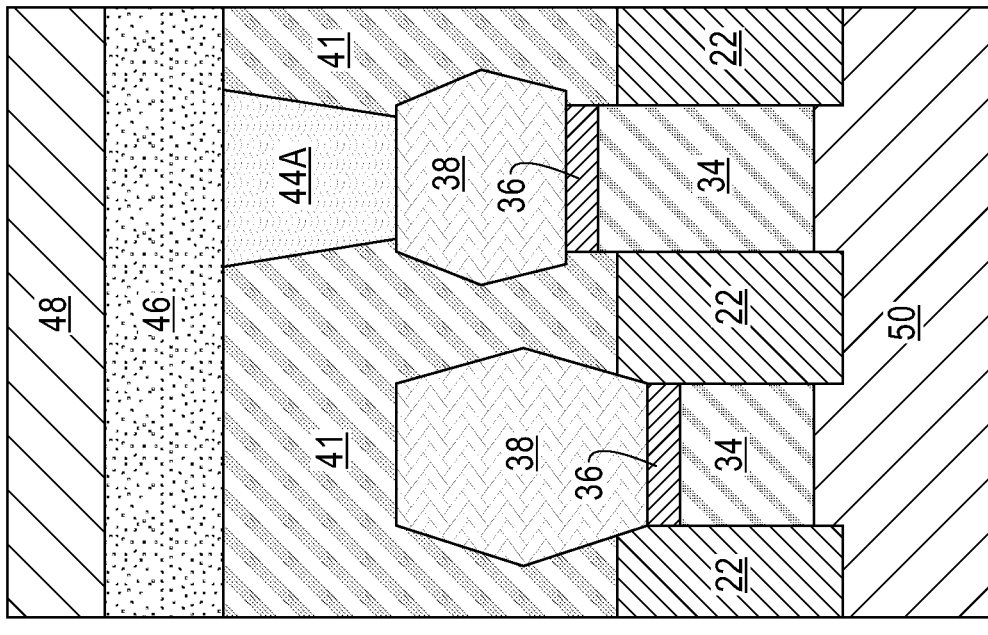
Figure 16B:
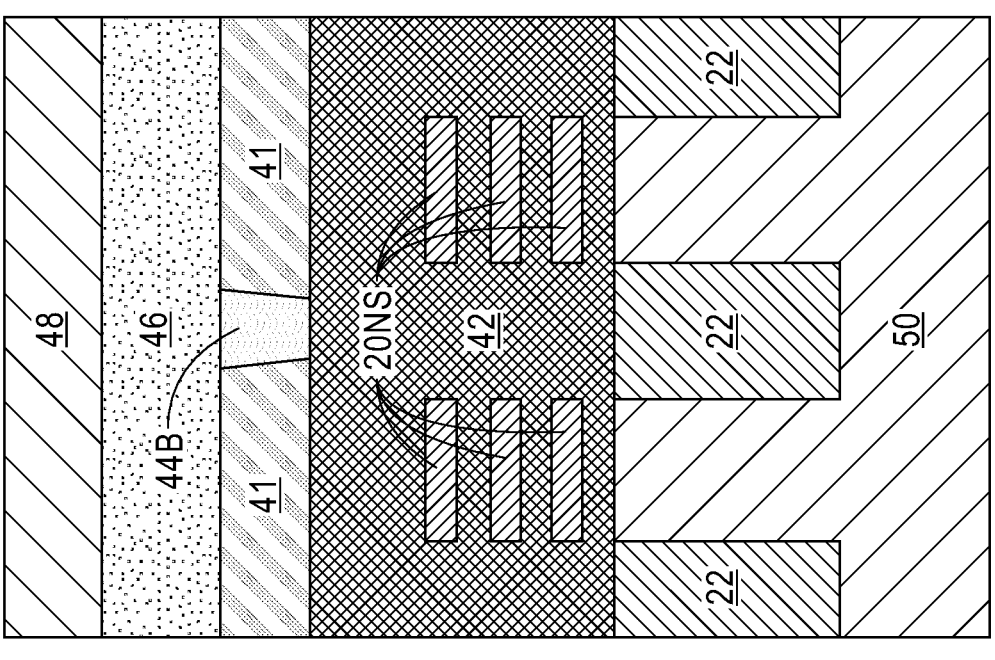

Referring now to FIGS. 16A, 16B and 16C, there are illustrated the exemplary semiconductor structure shown in FIGS. 15A, 15B and 15C, respectively, after forming a backside ILD layer 50. The backside ILD layer 50 includes one of the dielectric materials mentioned above for the first frontside ILD layer 40. The backside ILD layer 50 can be formed utilizing one of the deposition processes mentioned above in forming the first frontside ILD layer 40. The backside ILD layer 50 contacts sidewalls of both the semiconductor pedestal 17P and the lower inner spacers 31, and contacts surfaces of both the bottommost upper inner spacer 30 and the bottommost portion of the gate structure 42.

Figure 17A:
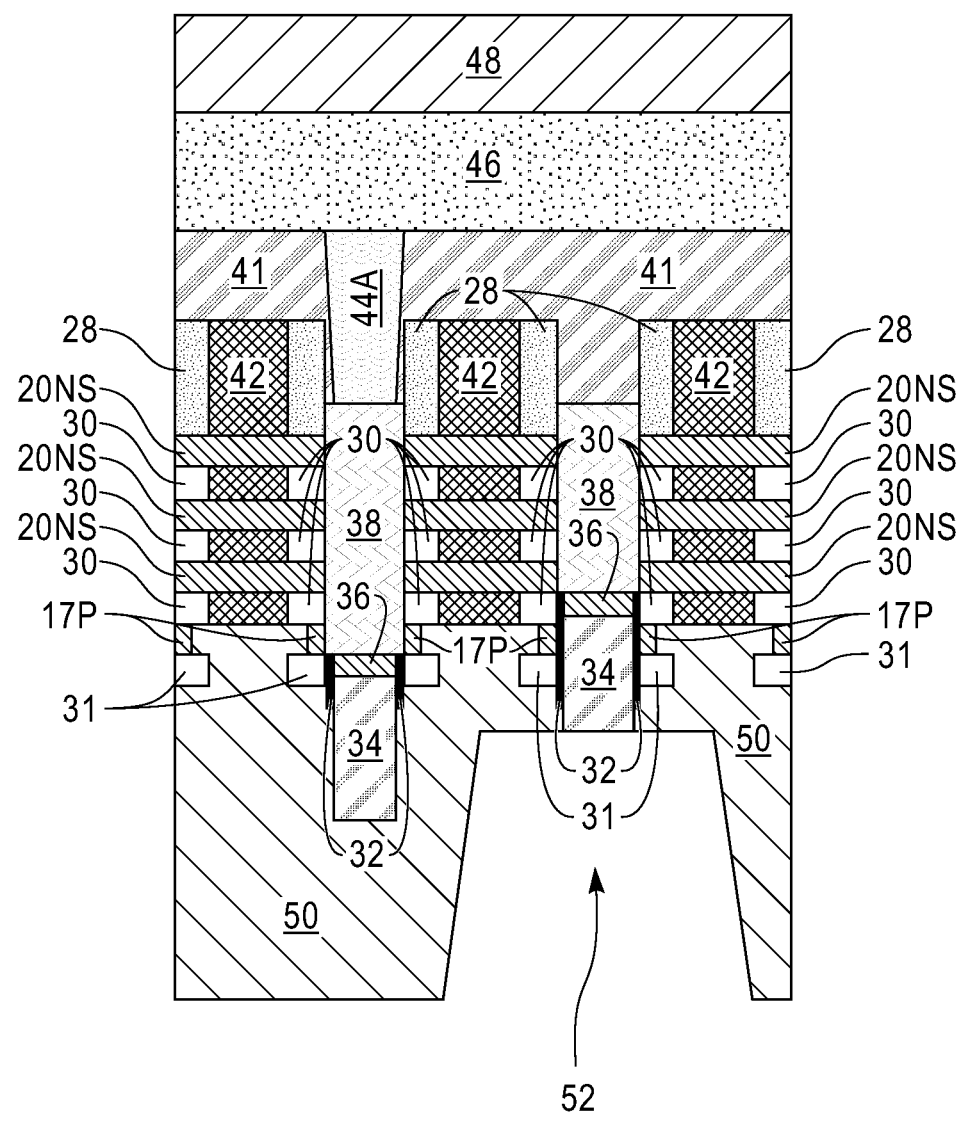
FIGS. 17A, 17B and 17C are cross sectional views of the exemplary semiconductor structure shown in FIGS. 16A, 16B and 16C, respectively, after backside contact patterning that reveals at least one of the backside source/drain contact placeholder structures.
Figure 17C:
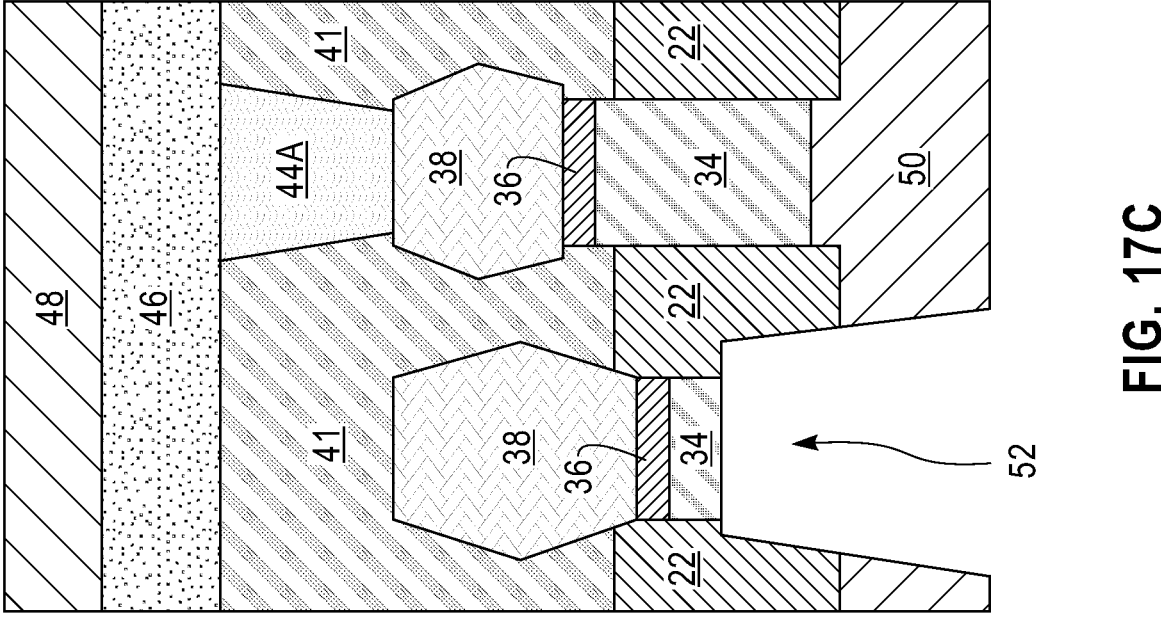
Figure 17B:
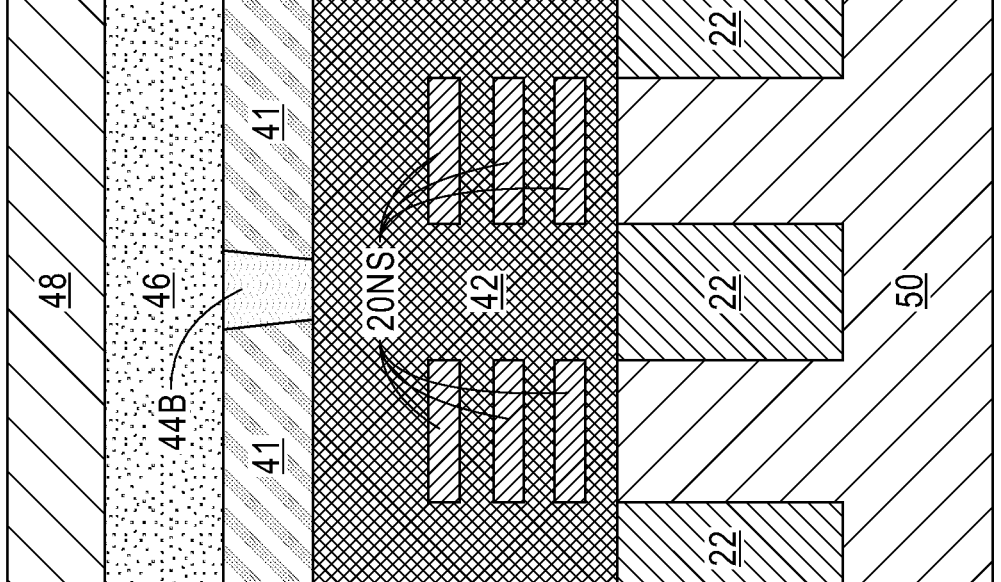

Referring now to FIGS. 17A, 17B and 17C, there are illustrated the exemplary semiconductor structure shown in FIGS. 16A, 16B and 16C, respectively, after backside contact patterning that reveals at least one of the backside source/drain contact placeholder structures 34. The backside contact patterning includes lithography and etching, wherein the etch forms an initial backside source/drain contact opening 52 in the backside ILD layer 50.

Figure 18A:
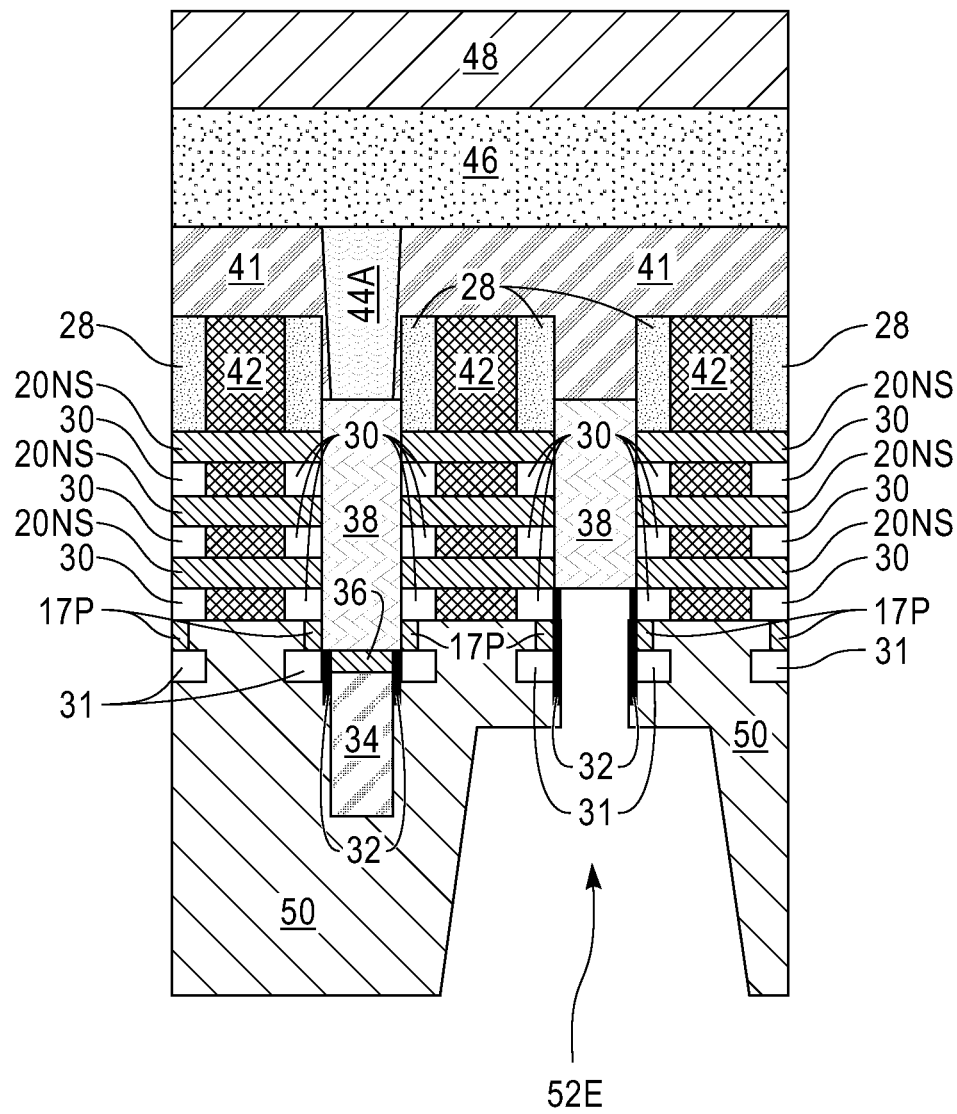
FIGS. 18A, 18B and 18C are cross sectional views of the exemplary semiconductor structure shown in FIGS. 17A, 17B and 17C, respectively, after removing the at least one revealed backside source/drain contact placeholder structure and the semiconductor buffer layer to physically expose one of the source/drain regions.
Figure 18C:
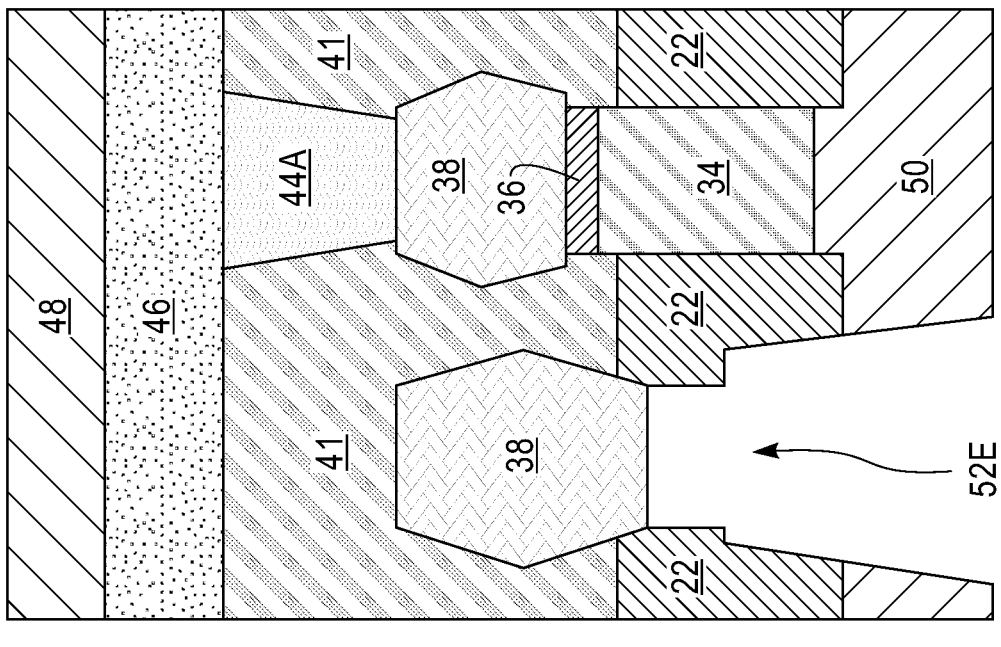
Figure 18C:
Figure 18B:
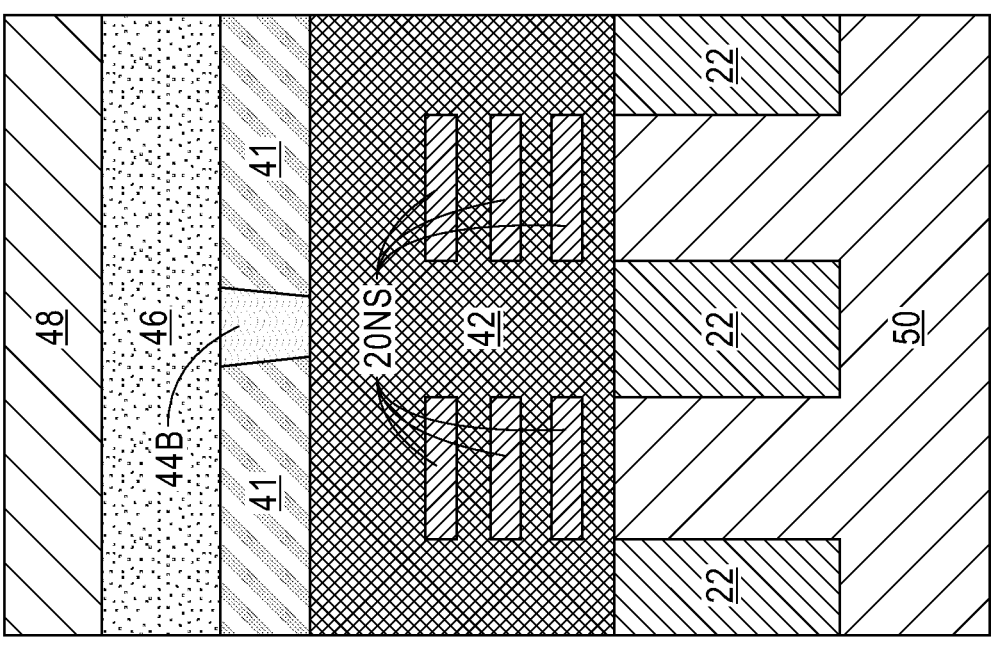

Referring now to FIGS. 18A, 18B and 18C, there are illustrated the exemplary semiconductor structure shown in FIGS. 17A, 17B and 17C, respectively, after removing the at least one revealed backside source/drain contact placeholder structure 34 and the semiconductor buffer layer 36 to physically expose one of the source/drain regions 38. The removal of the backside source/drain contact placeholder structure 34 includes a material removal process such as, for example, an etch, that is selective in removing the revealed backside source/drain contact placeholder structure 34. This removal reveals the semiconductor buffer layer 36. No damage to the source/drain regions 38 occurs. The revealed semiconductor buffer layer 36 is removed utilizing a material removal process such as, for example, an etch, that is selective in removing the revealed semiconductor buffer layer 36. The removal of the semiconductor buffer layer 36 reveals one of the source/drain regions 38 as shown in FIGS. 18A and 18C. These removal steps form backside source/drain contact opening 52E in the structure. As is illustrated, the backside source/drain contact opening 52E has a first portion that is self-aligned with respect to and nearest to the revealed source/drain region 38 that is narrower than a second portion of the backside source/drain contact opening 52E which is further from the revealed source/drain region 38.

Figure 19A:
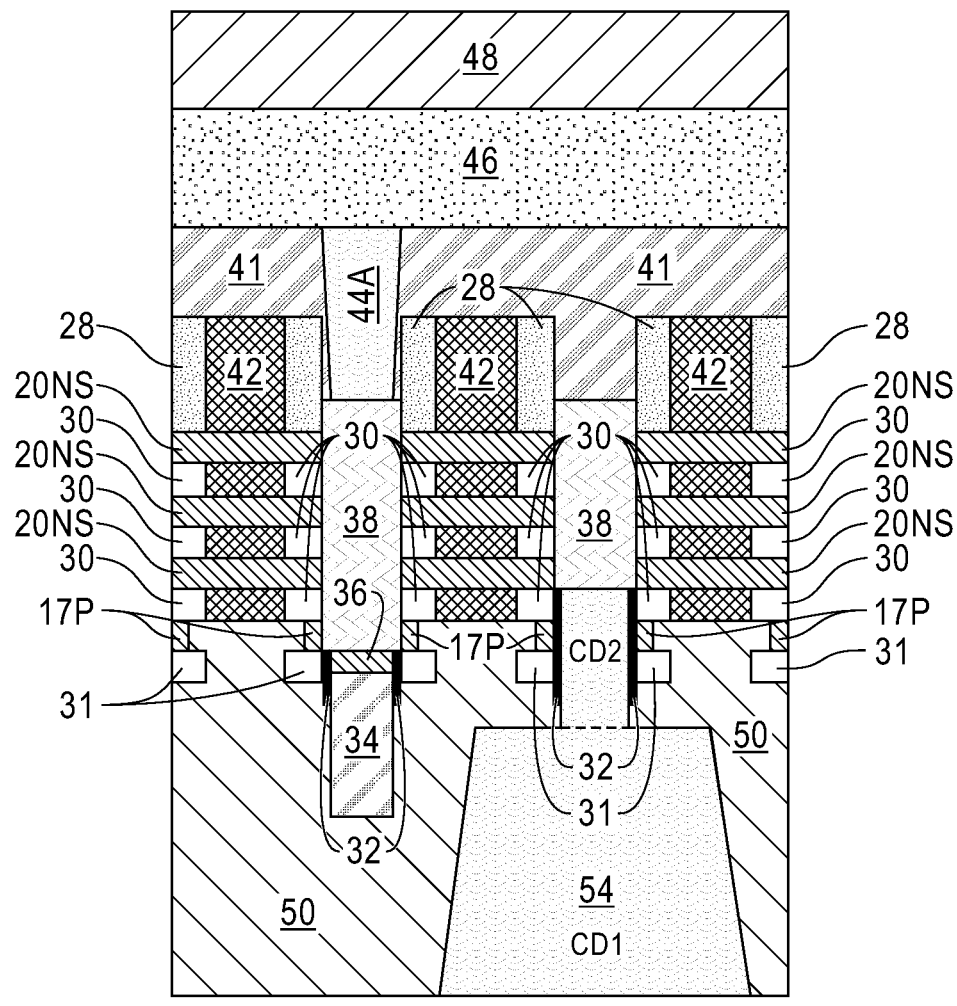
FIGS. 19A, 19B and 19C are cross sectional views of the exemplary semiconductor structure shown in FIGS. 18A, 18B and 18C, respectively, after forming a backside source/drain contact structure in direct physically contact with the physically exposed source/drain region.
Figure 19C:
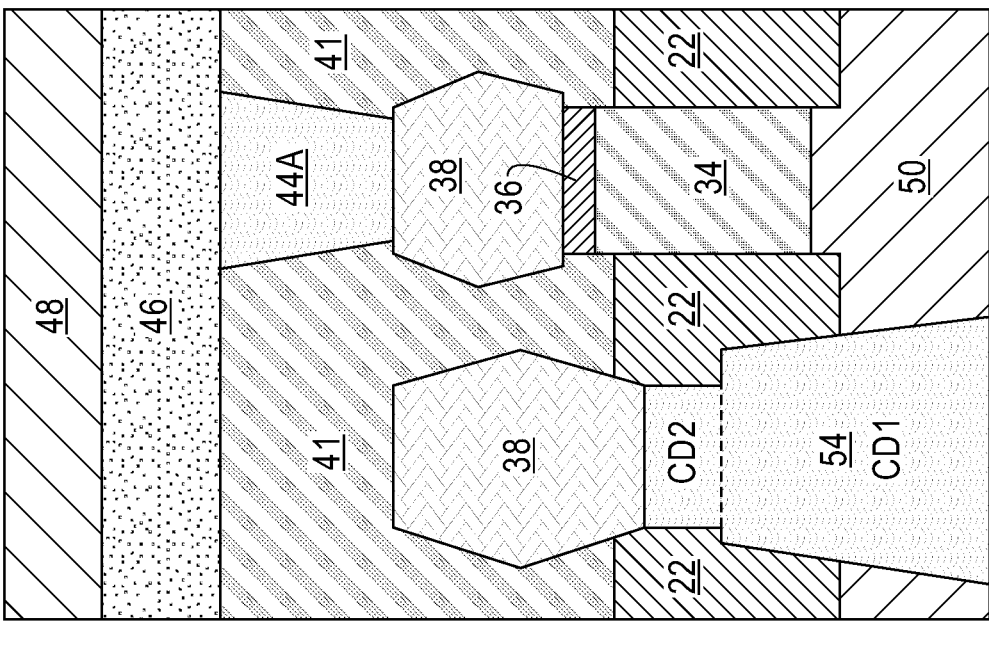
Figure 19B:
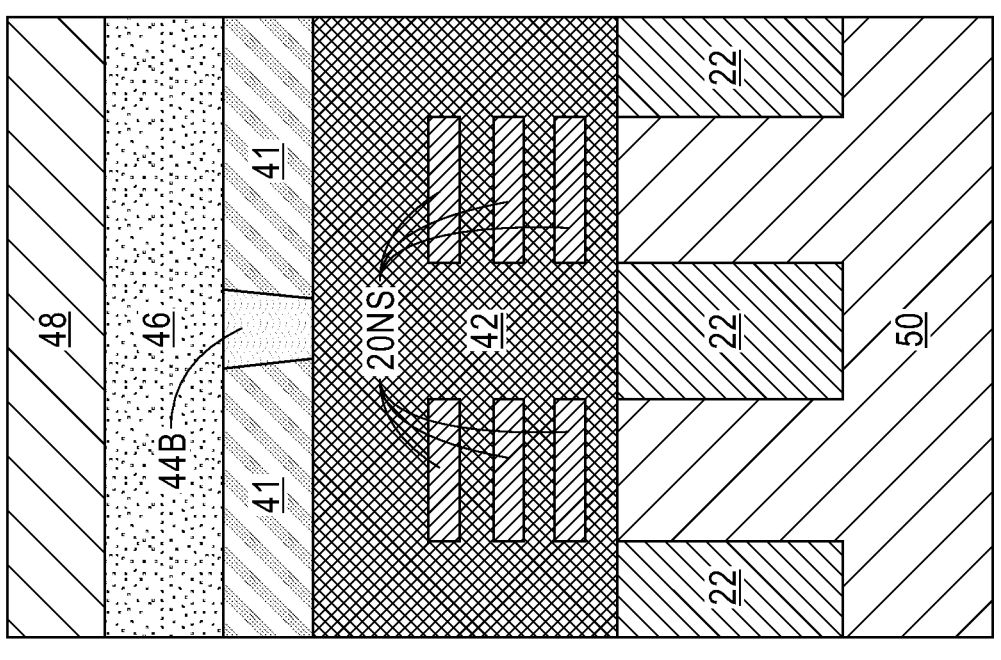

Referring now to FIGS. 19A, 19B and 19C, there are illustrated the exemplary semiconductor structure shown in FIGS. 18A, 18B and 18C, respectively, after forming a backside source/drain contact structure 54 in direct physically contact with the physically exposed source/drain region 38. Backside source/drain contact structure 54 includes filling (including deposition and planarization) the backside source/drain contact opening 52E with at least a contact conductor material, as defined above. Notably, the contact conductor material that can be used for providing the backside source/drain contact structure 54 includes, for example, a silicide liner, such as Ni, Pt, NiPt, an adhesion metal liner, such as TiN, and conductive metals such as W, Cu, Al, Co, Ru, Mo, Os, Ir, Rh, or an alloy thereof. The frontside contact structures can also include one or more contact liners (not shown). In one or more embodiments, the contact liner (not shown) can include a diffusion barrier material. Exemplary diffusion barrier materials include, but are not limited to, Ti, Ta, Ni, Co, Pt, W, Ru, TiN, TaN, WN, WC, an alloy thereof, or a stack thereof such as Ti/TiN and Ti/WC. In one or more embodiments in which a contact liner is present, the contact liner (not shown) can include a silicide liner, such as Ti, Ni, NiPt, etc., and a diffusion barrier material, as defined above. The backside source/drain contact structure 54 that is formed includes a first portion having a first critical dimension, CD1, and a second portion having a second critical dimension, CD2, wherein CD2 is smaller than CD1. In the present application, the second portion of the backside source/drain contact structure 54 having CD2 is closest to the source/drain region 38 than the second portion of the backside source/drain contact structure 54 having CD1. In FIGS. 19A and 19B, a dotted line is shown to represent a hypothetic boundary between the first and second portions of the backside source/drain contact structure 54.

As is shown in FIG. 19A, the second portion of the backside source/drain contact structure 54 defined by CD2 is lined with protective liner 32. The protective liner 32 prevents physically contact of the second portion of the backside source/drain contact structure 54 with each of the lower inner spacer 31, the semiconductor pedestal 17P, and the bottommost upper inner spacer 30 which encircle a sidewall of the backside source/drain contact structure 54. The lower portion of backside source/drain contact structure 54 defined by CD1 has sidewalls that are in contact with sidewalls of the shallow trench isolation structure 22 and the backside ILD layer 50.

Referring now to FIGS. 20A, 20B and 20C, there are illustrated the exemplary semiconductor structure shown in FIGS. 19A, 19B and 19C, respectively, after forming a backside interconnect structure 56. Backside interconnect structure 56 is formed on physically exposed surfaces of the backside ILD layer 50 and the backside source/drain contact structure 54. The backside interconnect structure 56 can include one or more interconnect dielectric material layers (including one of the dielectric materials mentioned above for the first frontside ILD layer 40) that contain backside metal wires (the metal wires can be composed of any electrically conductive metal or electrically conductive metal alloy) embedded therein.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
a nanosheet transistor comprising a plurality of spaced apart and vertically stacked semiconductor channel material nanosheets, a gate structure wrapped around each semiconductor channel material nanosheet of the plurality of spaced apart and vertically stacked semiconductor channel material nanosheets and a pair of source/drain regions;
upper inner spacers located between each vertically stacked pair of semiconductor channel material nanosheets of the plurality of spaced apart and vertically stacked semiconductor channel material nanosheets and beneath a bottommost semiconductor channel material nanosheet of the plurality of spaced apart and vertically stacked semiconductor channel material nanosheets;
lower inner spacers located beneath bottommost upper inner spacers, wherein each of the lower inner spacers is vertically separated from the bottommost upper inner spacers by a semiconductor pedestal; and
a backside source/drain contact structure contacting a first source/drain region of the pair of source/drain regions, wherein the backside source/drain contact structure has a first portion and a second portion, wherein the second portion of the backside source/drain contact structure is confined by the bottommost upper inner spacers, the lower inner spacers and the semiconductor pedestal.

2. The semiconductor structure of claim 1, wherein the first portion has a first critical dimension, and the second portion has a second critical dimension, wherein the second critical dimension is less than the first critical dimension.

3. The semiconductor structure of claim 1, further comprising a protective liner separating the second portion of the backside source/drain contact structure from the bottommost upper inner spacers, the lower inner spacers and the semiconductor pedestal.

4. The semiconductor structure of claim 3, wherein the protective liner contacts a surface of the first source/drain region that is in contact with the backside source/drain contact structure.

5. The semiconductor structure of claim 1, wherein a second source/drain region of the pair of source/drain regions is located on a semiconductor buffer layer.

6. The semiconductor structure of claim 5, wherein the semiconductor buffer layer is located on a surface of a backside source/drain contact placeholder structure.

7. The semiconductor structure of claim 6, further comprising a protective liner located on a sidewall of the semiconductor buffer layer and a sidewall of the backside source/drain contact placeholder structure, wherein the protective liner separates the semiconductor buffer layer and the backside source/drain contact placeholder structure from the lower inner spacers.

8. The semiconductor structure of claim 7, wherein the protective liner contacts a surface of the second source/drain region of the pair of source/drain regions.

9. The semiconductor structure of claim 7, wherein one of the semiconductor pedestals contacts a sidewall of the second source/drain region.

10. The semiconductor structure of claim 5, wherein the second source/drain region of the pair of source/drain regions has a vertical height that differs from a vertical height of the first source/drain region that contacts the backside source/drain contact structure.

11. The semiconductor structure of claim 5, further comprising a frontside source/drain contact structure contacting the second source/drain region of the pair of source/drain regions.

12. The semiconductor structure of claim 11, further comprising a frontside back-end-of-the-line (BEOL) structure contacting the frontside source/drain contact structure.

13. The semiconductor structure of claim 12, further comprising a frontside gate contact structure having a first surface contacting a gate electrode of the gate structure of the nanosheet transistor and a second surface opposite the first surface that contacts the frontside BEOL structure.

14. The semiconductor structure of claim 1, further comprising a backside interconnect structure contacting a surface of the backside source/drain contact structure.

15. The semiconductor structure of claim 1, wherein the semiconductor pedestal has a width that is less than a width of the upper inner spacers and a width of the lower inner spacers.

16. The semiconductor structure of claim 1, further comprising a backside interlayer dielectric (ILD) layer located beneath the nanosheet transistor and surrounding the backside source/drain contact structure.

17. The semiconductor structure of claim 16, wherein the backside ILD layer contacts sidewalls of both the semiconductor pedestal and the lower inner spacers.

18. The semiconductor structure of claim 17, wherein the backside ILD layer further contacts surfaces of both the bottommost upper inner spacers and a bottommost portion of the gate structure.

19. The semiconductor structure of claim 1, further comprising a shallow trench isolation structure located adjacent to the backside source/drain contact structure.

20. The semiconductor structure of claim 19, further comprising a backside source/drain contact placeholder structure laterally adjacent to the shallow trench isolation structure, wherein a semiconductor buffer layer is located on the backside source/drain contact placeholder structure and a second source/drain region of the pair of source/drain regions is located on the semiconductor buffer layer.

* * * * *